United States Patent
Guzelgoz et al.

(10) Patent No.: US 12,413,336 B2
(45) Date of Patent: *Sep. 9, 2025

(54) METHODS AND APPARATUS FOR DECODING RECEIVED UPLINK TRANSMISSIONS USING LOG-LIKELIHOOD RATIO (LLR) OPTIMIZATION

(71) Applicant: Marvell Asia Pte, Ltd., Singapore (SG)

(72) Inventors: Sabih Guzelgoz, San Jose, CA (US); Hong Jik Kim, San Jose, CA (US)

(73) Assignee: Marvell Asia Pte, Ltd, Singapore (SG)

(*) Notice: Subject to any disclaimer, the term of this patent is extended or adjusted under 35 U.S.C. 154(b) by 78 days.

This patent is subject to a terminal disclaimer.

(21) Appl. No.: 18/074,506

(22) Filed: Dec. 4, 2022

(65) Prior Publication Data

US 2023/0120502 A1    Apr. 20, 2023

Related U.S. Application Data

(63) Continuation of application No. 17/173,041, filed on Feb. 10, 2021, now Pat. No. 11,558,147.

(60) Provisional application No. 62/975,080, filed on Feb. 11, 2020.

(51) Int. Cl.
- *H04L 1/00* (2006.01)
- *G06N 5/04* (2023.01)
- *G06N 20/00* (2019.01)

(52) U.S. Cl.
CPC ............ *H04L 1/0054* (2013.01); *G06N 5/04* (2013.01); *G06N 20/00* (2019.01)

(58) Field of Classification Search
CPC ....... G06N 20/00; H04L 1/005; H04L 1/0054; H03M 13/1105; H03M 13/2957; H03M 13/13; H03M 13/3927

See application file for complete search history.

(56) References Cited

U.S. PATENT DOCUMENTS

| | | |
|---|---|---|
| 2012/0121047 A1 | 5/2012 | Jia et al. |
| 2016/0191078 A1* | 6/2016 | Gilbert ............... H03M 13/1128 714/776 |
| 2016/0336966 A1* | 11/2016 | Anderson ......... H03M 13/6591 |
| 2017/0171854 A1 | 6/2017 | Guzelgoz et al. |
| 2018/0316463 A1 | 11/2018 | Ren |
| 2019/0165807 A1* | 5/2019 | Wang .................. H03M 13/091 |
| 2020/0252080 A1* | 8/2020 | Lam .................... H03M 13/112 |

(Continued)

OTHER PUBLICATIONS

Ori Shental and Jakob Houndis, "Machine LLRning: Learning to Softly Demodulate", 2019 IEEE Globecom Workshops (GC Wkshps) (Year: 2019).*

*Primary Examiner* — Aristocratis Fotakis
(74) *Attorney, Agent, or Firm* — JW Law Group; James M. Wu

(57) ABSTRACT

Methods and apparatus for decoding received uplink transmissions using log-likelihood ratio optimization. In an embodiment, a method includes soft-demapping resource elements based on soft-demapping parameters as part of a process to generate log-likelihood ratios (LLR) values, decoding the LLRs to generate decoded data, and identifying a target performance value. The method also includes determining a performance metric from the decoded data, and performing a machine learning algorithm that dynamically adjusts the soft-demapping parameters to move the performance metric toward the target performance value.

25 Claims, 19 Drawing Sheets

(56) References Cited

U.S. PATENT DOCUMENTS

2020/0343962 A1* 10/2020 Kwon .................... G06N 3/006
2021/0075446 A1* 3/2021 Zhang ................ G06F 11/1012
2021/0119848 A1* 4/2021 Ibars Casas .......... H04L 1/0052

\* cited by examiner

■ LLRs for padding (-128) shall be removed at the first stage
▨ LLRs for CSI2 (can be partly punctured as 0)
▦ LLRs for Data (can be partly punctured as 0)

METHODS AND APPARATUS FOR DECODING RECEIVED UPLINK TRANSMISSIONS USING LOG-LIKELIHOOD RATIO (LLR) OPTIMIZATION

PRIORITY

This is a continuation patent application of U.S. patent application having a U.S. patent application Ser. No. 17/173,041, filed on Feb. 10, 2021 in the name of the same inventor and entitled "Methods and Apparatus for Decoding Received Uplink Transmissions Using Log-Likelihood Ratio (LLR) Optimization," issued into a U.S. patent with a U.S. Pat. No. 11,558,147 on Jan. 17, 2023, which further claims priority from U.S. Provisional Application No. 62/975,080 filed on Feb. 11, 2020 and entitled "Log-Likelihood Ratio (LLR) Optimization for 5G by Machine Learning," all of which are hereby incorporated herein by reference in their entireties.

FIELD

The exemplary embodiments of the present invention relate to operation of telecommunications networks. More specifically, the exemplary embodiments of the present invention relate to receiving and processing data streams using a wireless telecommunication network.

BACKGROUND

With a rapidly growing trend of mobile and remote data access over a high-speed communication network such as Long Term Evolution (LTE), fourth generation (4G), fifth generation (5G) cellular services, accurately delivering and deciphering data streams become increasingly challenging and difficult. The high-speed communication network, which is capable of delivering information includes, but is not limited to, wireless networks, cellular networks, wireless personal area networks ("WPAN"), wireless local area networks ("WLAN"), wireless metropolitan area networks ("MAN"), or the like. While WPAN can be Bluetooth or ZigBee, WLAN may be a Wi-Fi network in accordance with IEEE 802.11 WLAN standards.

In 5G systems, reference signals, data, and uplink control information (UCI) may be included in uplink transmissions from user equipment. The reference signals (RS) are used to estimate channel conditions or for other purposes. However, the reference signals are mixed in with data so that the reference signals must be accounted for when the data and/or UCI information is processed. For example, when processing resource elements (REs) received in an uplink transmission, special processing may be needed to skip over resource elements that contain reference signals. Even if the reference signals are set to zero or empty, their resource elements still need to be accounted for when processing the received data. It is also desirable to provide efficient descrambling, combining, and decoding functions to process received uplink transmissions.

Therefore, it is desirable to have a system that enables efficient processing of data and UCI information received in uplink transmissions.

SUMMARY

In various exemplary embodiments, methods and apparatus are provided for a decoding system that enables fast and efficient processing of received 4G and/or 5G uplink transmissions. In various exemplary embodiments, a decoder is provided that decodes received uplink transmissions using log-likelihood ratio (LLR) optimization.

In an embodiment, a resource element identifier indexes and categorizes uplink control information (UCI) of received uplink symbols into one of three categories. For example, the UCI information comprises hybrid automatic repeat request ("HARQ") acknowledgements ("ACK"), first channel state information ("CSI1"), and second channel state information (CSI2). For example, category 0 is data or CSI2 information, category 1 is ACK information, and category 2 is CSI1 information. In one embodiment, the categorization information is forwarded to a combiner/extractor that receives descrambled resource elements. The categorization information is used to identify and combine uplink control information from the descrambled resource elements for each symbol. For example, resource elements containing ACK are combined, resource elements containing CSI1 are combined, and resource elements containing CSI2 are combined. The combining is performed over a selected number of received symbols.

In an embodiment, a decoder system is provided includes LLR preprocessors that divide an LLR stream into separate data and CSI2 LLR streams. Separate decoders decode the streams to generate decoded information. Thus, in various exemplary embodiments, received uplink control information is descrambled, combined, and decoded to obtain UCI information to provide efficient processing and enhanced system performance.

In an embodiment, a method is provided that includes soft-demapping resource elements based on soft-demapping parameters as part of a process to generate log-likelihood ratios (LLR) values, decoding the LLRs to generate decoded data, and identifying a target performance value. The method also includes determining a performance metric from the decoded data, and performing a machine learning algorithm that dynamically adjusts the soft-demapping parameters to move the performance metric toward the target performance value.

In an embodiment, an apparatus is provided that includes a soft-demapper configured to soft-demap resource elements based on soft-demapping parameters as part of a process to generate log-likelihood ratio (LLR) values, a decoder configured to decode data from the LLRs. The apparatus also includes a machine learning circuit configured to: identify a target performance value; determine a performance metric from the decoded data; and perform a machine learning algorithm that dynamically adjusts the soft-demapping parameters to move the performance metric toward the target performance value.

In an embodiment, an apparatus is provided that includes means for soft-demapping resource elements based on soft-demapping parameters as part of a process to generate log-likelihood ratios (LLR) values; means for decoding the LLRs to generate decoded data; means for identifying a target performance value; means for determining a performance metric from the decoded data; and means for performing a machine learning algorithm that dynamically adjusts the soft-demapping parameters to move the performance metric toward the target performance value.

Additional features and benefits of the exemplary embodiments of the present invention will become apparent from the detailed description, figures and claims set forth below.

BRIEF DESCRIPTION OF THE DRAWINGS

The exemplary aspects of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
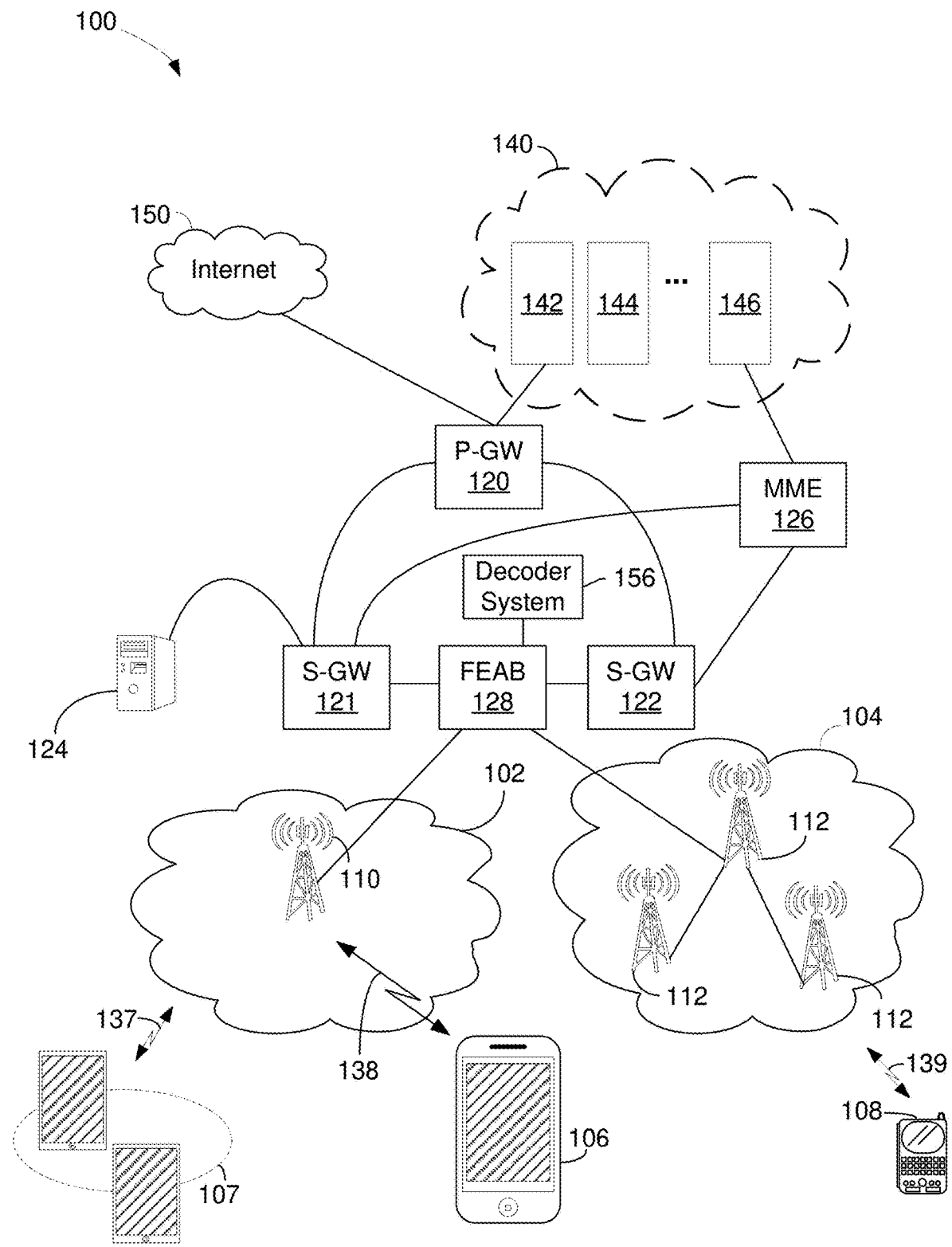
FIG. 1 shows a block diagram of a communication network in which resource elements received in uplink transmissions from user equipment are descrambled and combined by exemplary embodiments of a descrambling and combining system.

Aspects of the present invention are described below in the context of methods and apparatus for processing uplink information received in a wireless transmission.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application and business related constraints, and that these specific goals will vary from one implementation to another and from one developer to another. Moreover, it will be understood that such a development effort might be complex and time-consuming, but would nevertheless be a routine undertaking of engineering for those of ordinary skills in the art having the benefit of embodiments of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

The term "system" or "device" is used generically herein to describe any number of components, elements, subsystems, devices, packet switch elements, packet switches, access switches, routers, networks, modems, base stations, eNB (eNodeB), computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

IP communication network, IP network, or communication network means any type of network having an access network that is able to transmit data in a form of packets or cells, such as ATM (Asynchronous Transfer Mode) type, on a transport medium, for example, the TCP/IP or UDP/IP type. ATM cells are the result of decomposition (or segmentation) of packets of data, IP type, and those packets (here IP packets) comprise an IP header, a header specific to the transport medium (for example UDP or TCP) and payload data. The IP network may also include a satellite network, a DVB-RCS (Digital Video Broadcasting-Return Channel System) network, providing Internet access via satellite, or an SDMB (Satellite Digital Multimedia Broadcast) network, a terrestrial network, a cable (xDSL) network or a mobile or cellular network (GPRS/EDGE, or UMTS (where applicable of the MBMS (Multimedia Broadcast/Multicast Services) type, or the evolution of the UMTS known as LTE (Long Term Evolution), or DVB-H (Digital Video Broadcasting-Handhelds)), or a hybrid (satellite and terrestrial) network.

FIG. 1 shows a block diagram of a communication network 100 in which resource elements received in uplink transmissions from user equipment are decoded by exemplary embodiments of a decoder system 156. The network 100 includes packet data network gateway ("P-GW") 120, two serving gateways ("S-GWs") 121-122, two base stations (or cell sites) 102-104, server 124, and Internet 150. P-GW 120 includes various components 140, such as billing module 142, subscribing module 144, and/or tracking module 146 to facilitate routing activities between sources and destinations. It should be noted that the underlying concept of the exemplary embodiments would not change if one or more blocks (or devices) were added to or removed from network 100.

The network 100 may operate as a fourth generation ("4G"), Long Term Evolution (LTE), Fifth Generation (5G), New Radio (NR), or combination of 4G and 5G cellular network configurations. Mobility Management Entity (MME) 126, in one aspect, is coupled to base stations (or cell site) and S-GWs capable of facilitating data transfer between 4G LTE and 5G. MME 126 performs various controlling/managing functions, network securities, and resource allocations.

S-GW 121 or 122, in one example, coupled to P-GW 120, MME 126, and base stations 102 or 104, is capable of routing data packets from base station 102, or eNodeB, to P-GW 120 and/or MME 126. A function of S-GW 121 or 122 is to perform an anchoring function for mobility between 3G and 4G equipment. S-GW 122 is also able to perform various network management functions, such as terminating paths, paging idle UEs, storing data, routing information, generating replica, and the like.

P-GW 120, coupled to S-GWs 121-122 and Internet 150, is able to provide network communication between user equipment ("UE") and IP based networks such as Internet 150. P-GW 120 is used for connectivity, packet filtering, inspection, data usage, billing, or PCRF (policy and charging rules function) enforcement, et cetera. P-GW 120 also provides an anchoring function for mobility between 4G and 5G packet core networks.

Base station 102 or 104, also known as cell site, node B, or eNodeB, includes one or more radio towers 110 or 112. Radio tower 110 or 112 is further coupled to various UEs, such as a cellular phone 106, a handheld device 108, tablets and/or iPad® 107 via wireless communications or channels 137-139. Devices 106-108 can be portable devices or mobile devices, such as iPhone®, BlackBerry®, Android®, and so on. Base station 102 facilitates network communication between mobile devices, such as UEs 106-107, with S-GW 121 via radio towers 110. It should be noted that base station or cell site could include additional radio towers as well as other land switching circuitry.

To improve efficiency and/or speed-up processing of uplink control information received in uplink transmissions from user equipment, the decoder system 156 is provided to decode data and UCI information received in uplink transmissions. A more detailed description of the decoder system 156 is provided below.

Figure 2:
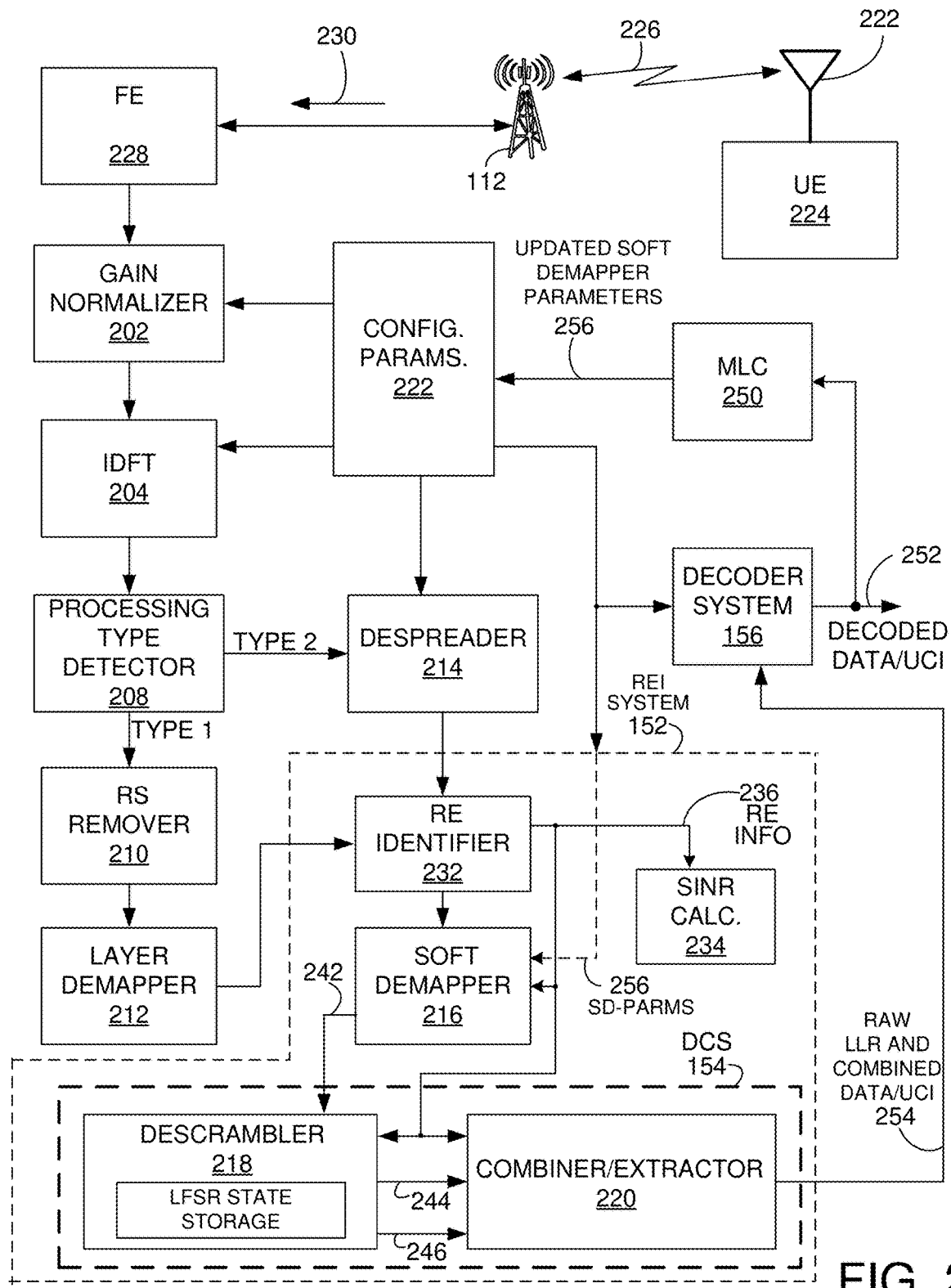
FIG. 2 shows an exemplary detailed embodiment of a descrambling and combining system.

FIG. 2 shows an exemplary detailed embodiment of an RE1 system 152. FIG. 2 shows user equipment ("UE") 224 having antenna 222 that allows wireless communication with base station 112 through wireless transmissions 226. The UE 224 transmits uplink communications 230 that are received by base station front end (FE) 228. In an embodiment, the base station includes gain normalizer 202, inverse transform block (IDFT) 204, configuration parameters 222, processing type detector 208, RS remover 210, layer demapper 212, despreader 214, and the RE1 system 152. In an embodiment, the RE1 system 152 comprises, RE identifier 232, soft-demapper 216, SINR calculator 234 and a descrambling and combining system (DCS) 154. In an embodiment, the DCS 154 comprises descrambler 218 and combiner/extractor 220. In an embodiment, combined data and UCI information output from the DCS 154 is input to the decoder system 156 that outputs decoded information. In an embodiment, a machine learning circuit (MLC) 250 is provided that receives the decoded data/UCI 252 and generates a performance metric that is used by a machine learning algorithm to determine updated soft-demapper parameters 256 that are used to perform soft-demapping to achieve selected system performance.

In an embodiment, the receiver of the uplink transmission processes 1 symbol at a time, which may come from multiple layers for NR, and the receiver of the uplink transmission processes the whole subframe or slot of a layer for LTE covering 1 ms transmission time interval (TTI), 7-OFDM symbol (OS) short(s) TTI, and 2/3-OS sTTI. The modulation order can be derived as follows.
  1. ($\pi/2$) BPSK for NR
  2. ($\pi/2$) BPSK for LTE sub-PRB, QPSK, 16QAM, 64QAM, and 256QAM Furthermore, demapping rules apply to constellations as defined in LTE (4G) and/or NR (5G) Standards.

Configuration Parameters (Block 222)

In an embodiment, the configuration parameters 222 comprise multiple fields that contain parameters for use by multiple blocks shown in FIG. 2. For example, some of the configuration parameters 222 control the operation of the gain normalizer 202, IDFT 204, RE1 system 152, and decoder system 156. In an embodiment, the configuration parameters 222 may indicate that the gain normalizer 202 and the IDFT 204 are to be bypassed. In an embodiment, the configuration parameters 222 are used by the soft-demapper 216 to determine when to apply special treatment when soft-demapping received resource elements. The configuration parameters 222 are also used to control the operation of the descrambler 218, combiner/extractor 220, and/or the SINR calculator 234.

Gain Normalizer (Block 202)

In an embodiment, the gain normalizer 202 performs a gain normalization function on the received uplink transmission. For example, the gain normalizer 202 is applicable to LTE and NR DFT-s-OFDM cases. Input samples will be normalized as follows per data symbol per subcarrier with a norm gain value calculated per symbol as follows.

Gainnorm_out[Ds][sc]=(Gainnorm_in[Ds][sc])/(Norm_Gain[Ds])

IDFT (Block 204)

The IDFT 204 operates to provide an inverse transform to generate time domain signals. In an embodiment, the IDFT 204 is enabled only for LTE and NR DFT-s-OFDM and LTE sub-PRB. In an embodiment, the inputs and outputs are assumed to be 16-bit I and Q values, respectively. The DFT and IDFT operations are defined as follows.

$$DFT: X[k] = \frac{1}{\sqrt{N}} \sum_{k=0}^{N-1} x[n] W_N^{kn}$$

and $$IDFT: X[k] = \frac{1}{\sqrt{N}} \sum_{n=0}^{N-1} x[n] W_N^{-kn}$$

where $W_N = e^{-2\pi j/N}$.

Processing Type Detector (Block 208)

In exemplary embodiments, the processing type detector 214 detects the type of processing to be performed by the system. For example, this information may be detected from the configuration parameters 222. In an embodiment, the processing type detector 208 operates to detect one of two processing types, which cover the operation of the system as follows.
1. Type 1-5G NR DFT-s-OFDM
2. Type 1-5G NR CP-OFDM
3. Type 2-5G NR PUCCH Format 4

RS Remover (Block 210)

In an embodiment, the RS remover 210 operates during Type 1 processing to remove RS resource elements from the received data stream to produce a stream of data that is input to the layer demapper. For example, the RE locations of the RS symbols are identified and the data is re-written into one or more buffers to remove the RS symbols to produce an output that contains only data/UCI. In an embodiment, Type 1 processing includes RS/DTX removal, layer demapping with an interleaving structure, soft-demapping, and descrambling. A benefit of removal of the RS REs before layering is to enable a single shot descrambling process without any disturbance in a continuous fashion with no extra buffering.

Layer Demapper (Block 212)

In an embodiment, data and signal to interference noise ratio (SINR) coming from multiple layers of a certain subcarrier will be transferred into a layer demapping circuit (not shown) via multi-threaded read DMA operation. In this case, each thread will point to the memory location of different layers for a certain symbol. The layer demapper 212 produces demapped data and multiple pSINR reports per layer. In an embodiment, for NR the DMRS/PTRS/DTX REs will be removed from the information stream prior to soft-demapping for both I/Q and SINR samples.

Despreader (Block 214)

In an embodiment, the despreader 214 provides despreading Type 2 processing for PUCCH Format 4 only. Despreading comprises combining the repeated symbols along the frequency axis upon multiplying them with the conjugate of the proper spreading sequence. The spreading sequence index as well as the spreading type for combining the information in a correct way will be given by the configuration parameters 222. This process is always performed over 12 REs in total. The number of REs that will be pushed into subsequent blocks will be reduced by half or ¼th after despreading depending upon the spreading type. Combined results will be averaged and stored as 16-bit information before soft-demapping.

RE1 System (Block 152)

In an embodiment, the RE1 system 152 comprises, the RE identifier 232, the soft-demapper 216, the descrambler 218, the combiner/extractor 220, and the SINR calculator 234. During operation the RE1 system 152 categorizes resource elements and passes these categorized REs to the soft-demapper 216 and one or more other blocks of the RE1 system 152. In an embodiment, the soft-demapper 216 uses the categorized REs to determine when to apply special treatment to the soft-demapping process.

In another embodiment, described in more detail below, the RE identifier 232 receives request for hypothesis index values for resource elements containing data/CSI2 information. The RE identifier 232 processes these requests to determine whether the RE contains data or a CSI2 value, and if the RE contains a CSI2 value by providing a hypothesis index value associated with the CSI2 value.

Resource Element Identifier (Block 232)

In an embodiment, the RE identifier 232 operates to process a received information stream of resource elements to identify, index, and categorized each element. An index and categorization of each element (e.g., RE information 236) is passed to the soft-demapper 216 and other blocks of the RE1 system 152. A more detailed description of the operation of the RE identifier 232 is provided below.

Figure 3:
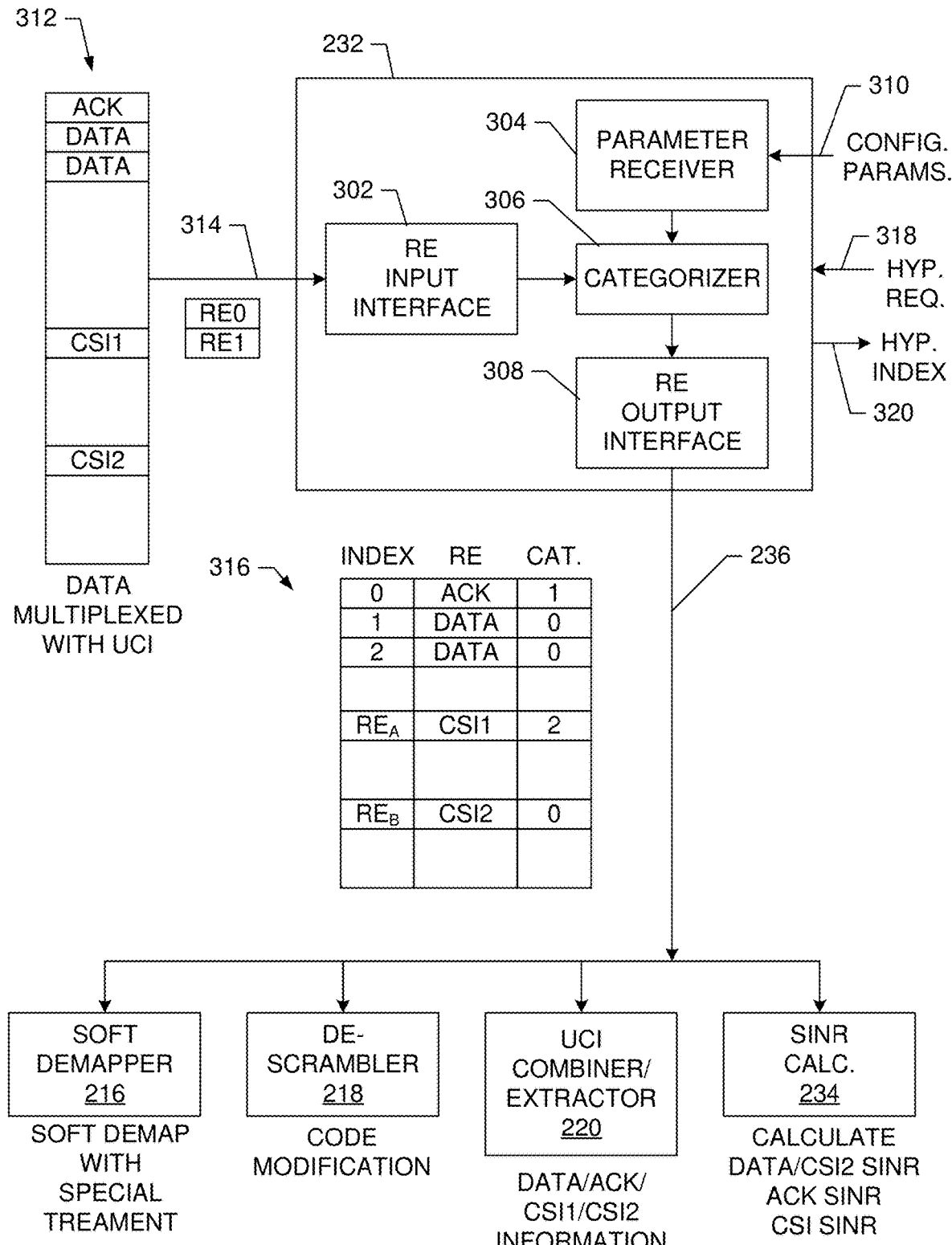
FIG. 3 shows a block diagram illustrating a detailed exemplary embodiment of an RE identifier block shown in FIG. 2.

FIG. 3 shows a block diagram illustrating a detailed exemplary embodiment of the RE identifier 232 shown in FIG. 2. As illustrated in FIG. 3, the RE identifier 232 comprises RE input interface 302, parameter receiver 304, categorizer 306, and RE output interface 308.

During operation, an uplink transmission is received and processed by the above described blocks to produce an information stream, such as the information stream 312. For example, the received uplink transmission is processed by at least one of the processing type detector 208, layer demapper 212, or the despreader 214. As a result, the information stream 312 does not contain any reference signals (RS) but contains data or data multiplexed with UCI information and this stream is input to the RE identifier 232.

The information stream 312, in one embodiment, includes information or data bits and UCI bits. In one example, the UCI bits, such as ACK bits, CSI1 bits, and/or data/CSI2 bits, are scattered throughout information stream 312. For instance, UCI bits are mixed with the data bits as illustrated.

In an embodiment, during 5G operation, the RE identifier 232 correctly identifies the RE indices of the UCI bits for soft-demapper special treatment, descrambler code modification, and UCI combining/extraction as shown in FIG. 2. The RE indices of the UCI bits are also used for generating the SINR report values for ACK and CSI1 as well for NR CP-OFDM operation.

In an embodiment, the RE identification process will process 2 REs per cycle, indicated at 314. For example, the resource elements of the received stream 312 are received by the RE input interface 302, which provides the received information to the categorizer 306. The parameter receiver 304 receives parameters 310 from the configuration parameter block 222. The categorizer 306 uses these parameters to categorize the received resource elements and after categorizing the received REs, the categorizer 306 stores the categorized REs in an array, such as the array 316, which shows index, RE value, and category. In an embodiment, the identification of RE1 can be obtained based on multiple hypotheses of RE0. Similarly, RE2 identification can be derived based on multiple hypotheses of RE0 and RE1. The RE output interface 308 outputs the categorized REs to the soft-demapper 216, descrambler 218, UCI combiner 220, and SINR calculator 234. In one aspect, the components of soft-demapper 216, descrambler 218, UCI combiner 220, and SINR calculator 234 are interconnected for transferring certain information between the components.

In an exemplary embodiment, the RE identifier 232 receives a request 318 for a hypothesis index value for an RE that contains data/CSI2 information. The request is received from the combiner/extractor 220. In response to the request 318, the RE identifier 232 determines if the RE contains data or CSI2 information. If the RE contains CSI2 information, a hypothesis index value associated with the CSI2 value is determined. In an embodiment, there are up to eleven (0-10) hypotheses associated with the CSI2 information. The RE identifier 232 then outputs the determined hypothesis index value 320 to the combiner/extractor for further processing.

Referring again to FIG. 2, in various embodiments, the soft-demapper 216 provides special treatment to REs based on certain UCI categories. The descrambler 218 is capable of providing scrambling code modification based on certain UCI categories. The UCI combiner/extractor 220 is capable of combining DATA, ACK, CSI1, and/or CSI2 information. The SINR calculator 234 is capable of calculating data/CSI2 SINR, as well as other RE related SINRs, such as an ACK SINR and a CSI SINR.

Soft-Demapper

The soft-demapping principle is based on computing the log-likelihood ratio (LLR) of a bit that quantifies the level of certainty on whether it is logical zero or one. The soft-demapper 216 processes symbol by symbol and RE by RE within a symbol.

The soft-demapping principle is based on computing the log-likelihood ratio (LLR) of a bit that quantifies the level of certainty on whether it is logical zero or one. Under the assumption of Gaussian noise, LLR for the i-th bit is given by:

$$LLR_i = \ln\left(\frac{P(\text{bit} = 0/r)}{P(\text{bit} = 1/r)}\right) = \ln\left(\frac{\sum_j e^{-\frac{(x-c_j)^2}{2\sigma^2}}}{\sum_k e^{-\frac{(x-c_k)^2}{2\sigma^2}}}\right) = \ln\left(\sum_j e^{-\frac{(x-c_j)^2}{2\sigma^2}}\right) - \ln\left(\sum_k e^{-\frac{(x-c_k)^2}{2\sigma^2}}\right) \quad \text{EQ. 1}$$

where $c_j$ and $c_k$ are the constellation points for which i-th bit takes the value of 0 and 1, respectively. Note that for the gray mapped modulation schemes given in [R1], x may be taken to refer to a single dimension I or Q. Computation complexity increases linearly with the modulation order. A max-log MAP approximation has been adopted in order to reduce the computational complexity. Note that this approximation is not necessary for QPSK since its LLR has only one term on both numerator and denominator.

$$\ln\sum_m e^{-d_m} \cong \max(-d_m) = \min(d_m)$$

This approximation is accurate enough especially in the high SNR region and simplifies the LLR calculation drastically avoiding the complex exponential and logarithmic operations. Given that I and Q are the real and imaginary parts of the input samples, the soft LLR is defined as follows for ($\pi/2$) BPSK, QPSK, 16QAM, 64QAM, and 256QAM, respectively.

In an embodiment, the soft-demapper 216 includes a first minimum function component ("MFC"), a second MFC, a special treatment component ("STC"), a subtractor, and/or an LLR generator. A function of soft-demapper 216 is to demap or ascertain soft bit information associated to received symbols or bit streams. For example, soft-demapper 216 employs soft-demapping principle which is based on computing the log-likelihood ratio (LLR) of a bit that quantifies the level of certainty as to whether it is a logical zero or one. To reduce noise and interference, soft-demapper 216 is also capable of discarding one or more unused constellation points relating to the frequency of the bit stream from the constellation map.

The STC, in one aspect, is configured to force an infinity value as one input to the first MFC when the stream of bits is identified and a special treatment is needed. For example, a predefined control signal with a specific set of encoding categories such as ACK with a set of predefined encoding categories requires a special treatment. One of the special treatments, in one aspect, is to force infinity values as inputs to MFCs. For example, STC force infinity values as inputs to the first and the second MFCs when the stream of bits is identified as ACK or CSI1 with a predefined encoding category. The STC, in one instance, is configured to determine whether a special treatment (or special treatment function) is required based on received bit stream or symbols. In one aspect, the 1-bit and 2-bit control signals with predefined encoding categories listed in Table 1 require special treatments. It should be noted that Table 1 is exemplary and that other configurations are possible.

TABLE 1

| No. | Control Signal with Encoding Categories | Renamed Categories |
|---|---|---|
| 1 | $O^{ACK} = 1$ | ACK[1] |
| 2 | $O^{ACK} = 2$ | ACK[2] |
| 3 | $O^{CSI1} = 1$ | CSI1[1] |
| 4 | $O^{CSI1} = 2$ | CSI1[2] |

SINR Calculator (Block 234)

The SINR calculator 234 calculates SINR for per UCI type based on categories received from RE1 block 232.

Descrambler (Block 218)

The descrambler 218 is configured to generate a descrambling sequence of bits or a stream of bits. For example, after generating a sequence in accordance with the input value, the descrambler determines whether a descrambling sequence modification is needed for certain categories of control information to be descrambled. For example, the descrambler 218 receives the categorized RE information 236 from the RE identifier 232 and uses this information to determine when descrambling sequence modification is required. In an embodiment, the descrambler also provides for storage of intermediate linear feedback shift register (LFSR) states to facilitate continuous descrambling sequence generation over multiple symbols. The descrambled resource elements 244 of the symbols are passed to the combiner/extractor 220 along with corresponding descrambling sequences 246. A more detailed description of the descrambler 218 is provided below.

Combiner/Extractor (Block 220)

The combiner/extractor 220 provides a combining and extracting function to combine descrambled soft bits from the descrambler 218 and extract uplink control information. In an embodiment, the combiner/extractor 220 modifies its operation based on categories received from RE1 block 232. A more detailed description of the combiner/extractor 220 is provided below.

Decoder System (Block 156)

The decoder system 156 decodes the raw LLR and combined data/UCI information 254 received from the combiner/extractor 220. In an embodiment, the decoder system 156 divides the combined data and CSI2 information into separate LLR streams based on the configuration parameters 222. The decoder system 156 then decodes each stream separately to generate decoded data and CSI2 (UCI) information 252. A more detailed description of the decoder system 156 is provided below.

Machine Learning Circuit (MLC) (Block 250)

In an embodiment, a machine learning circuit 250 is provided that receives the decoded data/UCI information 252 and determines a performance metric. Based on the determined performance metric, the MLC 250 performs a machine learning algorithm to generate updated soft-demapper parameters 256 that are input to the configuration parameters 222. In an embodiment, the parameters 256 are input to the soft-demapper 216 and used to determine the soft-demapped REs 242, which are processed into the raw LLR and combined data/UCI information 254 that is decoded by the decoder system 156. In an embodiment, the MLC 250 adjusts the soft-demapper parameters 256 until a desired performance metric is obtained. A more detailed description of the MLC 250 is provided below.

Figure 4A:
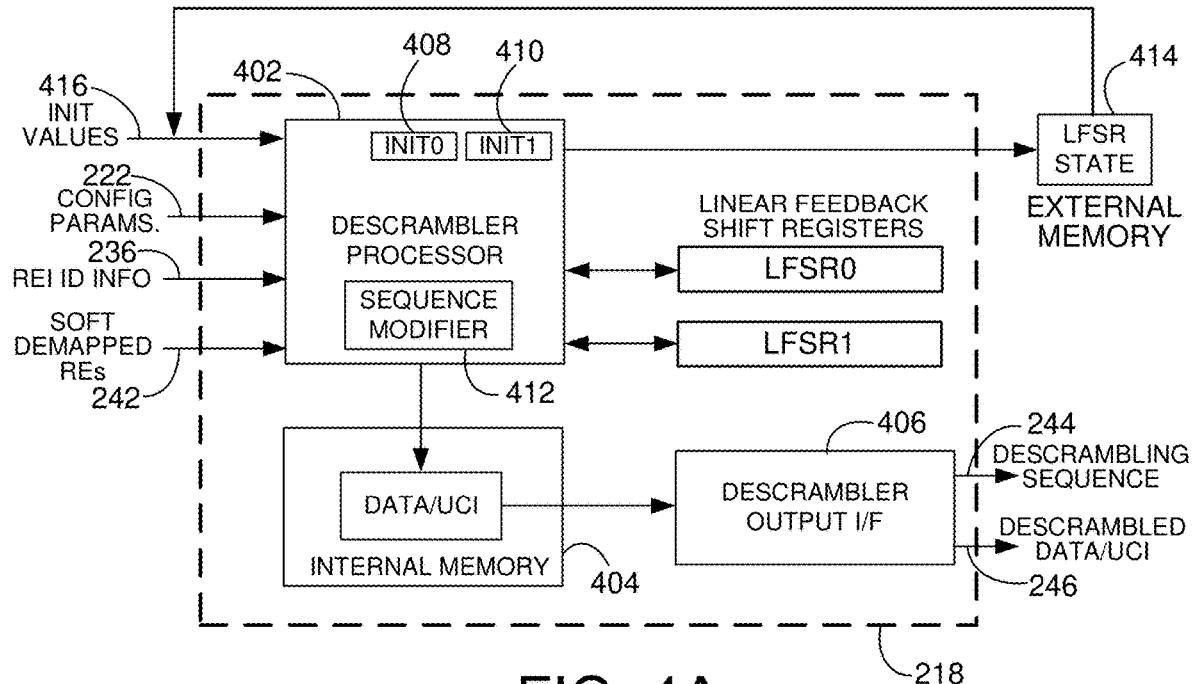
FIG. 4A shows a block diagram illustrating a detailed exemplary embodiment of a descrambler shown in FIG. 2.

FIG. 4A shows a block diagram illustrating a detailed exemplary embodiment of the descrambler 218 shown in FIG. 2. In an embodiment, the descrambler 218 comprises a descrambler processor 402, internal memory 404, linear feedback shift registers LFSR0 and LFSR1, and output interface 406. The descrambler processor 402 also includes a sequence modifier 412 that operates to modify descrambling sequences for certain categories of ACK and CSI1 information.

Figure 4B:
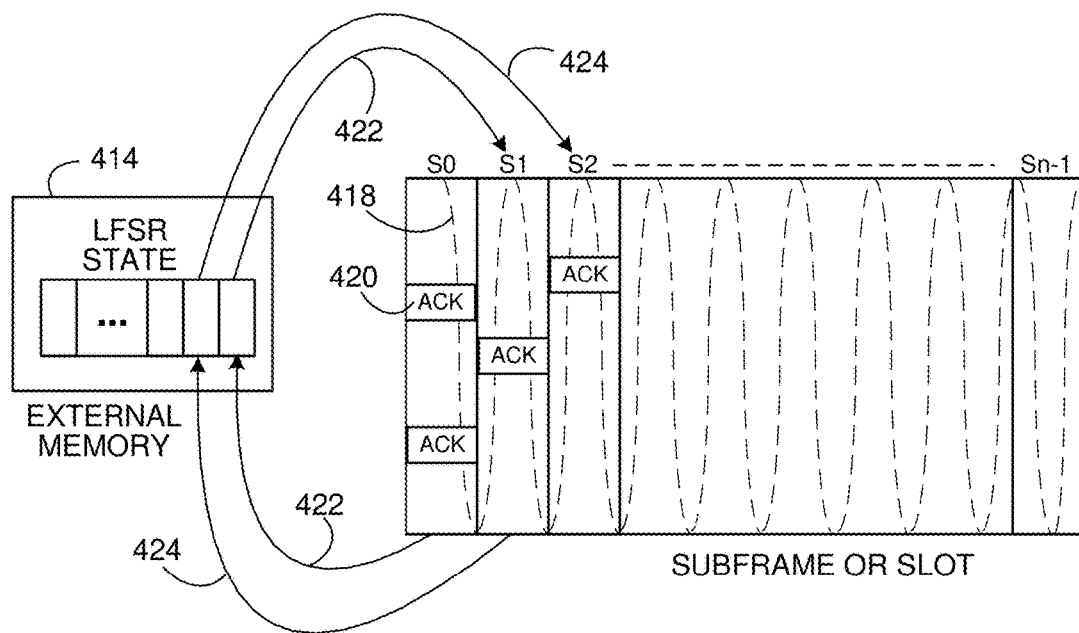
FIG. 4B shows a block diagram illustrating operations performed by the descrambler shown in FIG. 4A.

FIG. 4B shows a block diagram illustrating operations performed by the descrambler 218 shown in FIG. 4A. During operation, the descrambler processor 402 receives soft-demapped REs 242 from the soft-demapper 216. The descrambler processor 402 also receives selected configuration parameters 222, the RE information 236, and initialization values 416. In an embodiment, the initialization values 416 are provided by a central processor or other receiver entity and stored as INIT0 408 and INIT1 410. The descrambler processor 402 initializes the LFSR0 and LFSR1 using initialization values INIT0 408 and INIT1 410, respectively. The shift registers LFSR0 and LFSR1 output bits that are used to determine descrambling bits that are used to descramble the received REs 242. For example, outputs of the shift registers LFSR0 and LFSR1 are mathematically combined by the descrambler processor 402 to determine descrambling bits to be used to descramble the received REs 242.

As resource elements of a first symbol are received, the descrambler processor 402 uses descrambling bits that are determined from the output of the shift registers to descramble the received REs 242. For example, as the resource elements of symbol S0 are received, the descrambler processor 402 uses the generated descrambling bits to descramble the received resource elements. As each RE is descrambled (as indicated by the path 418), the descrambled REs are stored in the internal memory 404. After descrambling of all the REs of the symbol is completed, the descrambler processor 402 stores the state of the shift registers LFSR0/1 into the external memory 414. For example, at the end of symbol S0, the state 422 of LFSR0/1 is stored in the external memory 414. It should also be noted that the sequence modifier 412 could be used to modify descrambling sequences for certain categories of ACK and CSI1 information.

Before REs of the next symbol (e.g., S1) are descrambled, the LSFR state 422 is restored from the external memory 414 and provided as initialization values 416 to the descrambler processor 402. Thus, the restored state allows the operation of the shift registers to continue from where they left off after the completion of descrambling the previous symbol (e.g., S0). After descrambling the symbol S1, the descrambler processor 402 stores the state of the shift registers (indicated at 424) into the external memory 414. Prior to the start of descrambling of the symbol S3, the state 424 is restored to the LFSR registers of the descrambler processor 402 as described above. This process of storing and restoring the shift registers state continues until all the REs of all the symbols have been descrambled. It should be noted that the REs include data or UCI information. For example, symbol S0 includes the ACK 420 information shown in FIG. 4B. After the REs are descrambled, they are output by the descrambler output interface 406 as the descrambled REs 244 to the combiner/extractor 220. In an embodiment, the descrambling sequences 246 used to descramble the REs are also provided to the combiner/extractor 220.

Figure 5A:
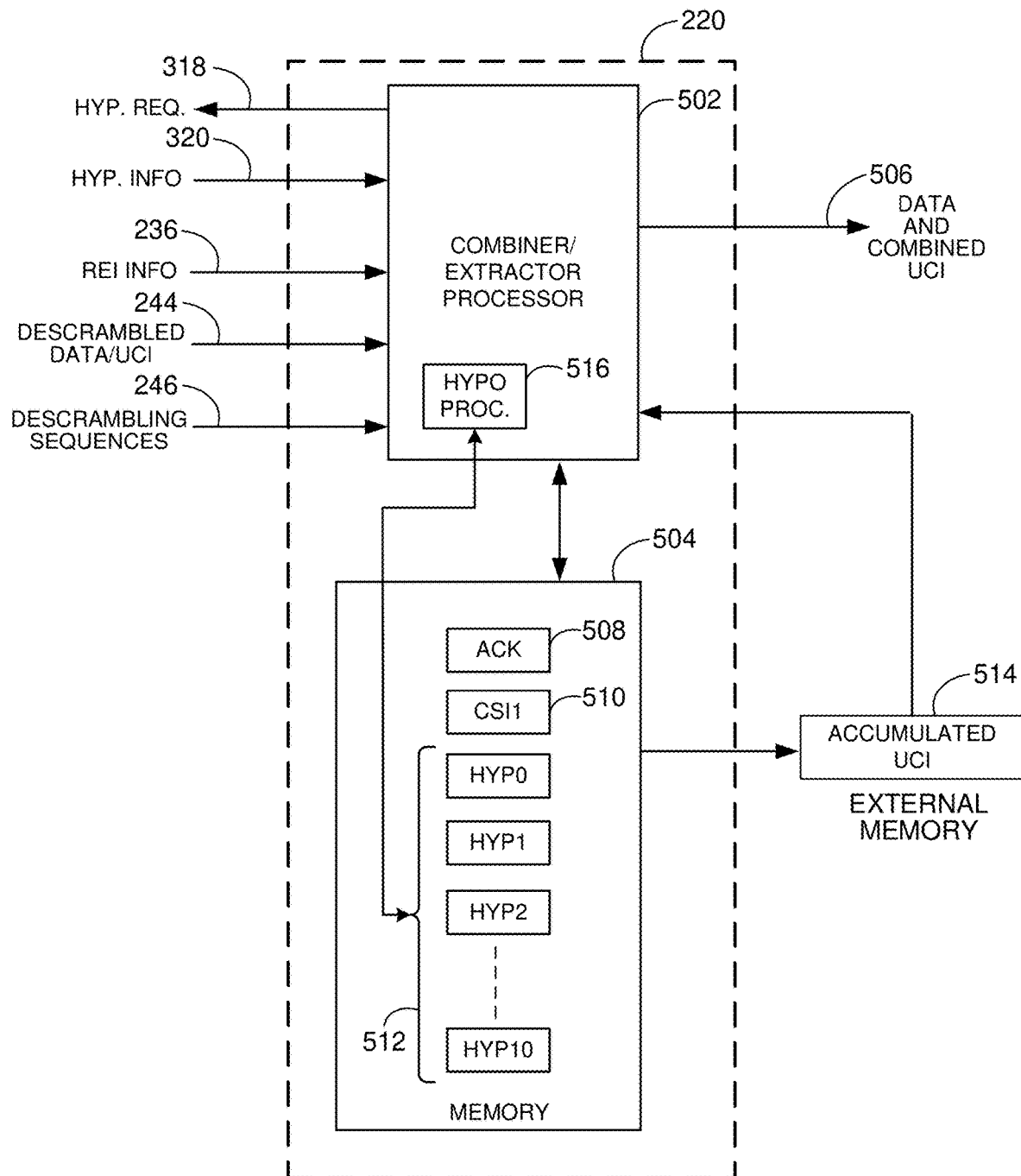
FIG. 5A shows a block diagram illustrating an exemplary embodiment of a combiner/extractor shown in FIG. 2.

FIG. 5A shows a block diagram illustrating a detailed exemplary embodiment of the combiner/extractor 220 shown in FIG. 2. In an embodiment, the combiner/extractor 220 comprises combiner/extractor processor 502 and internal storage 504. The processor 502 includes hypothesis processor 516. During operation, the processor 502 receives the RE information 236 and the descrambled REs 244 from the descrambler 218. The processor 502 also receives descrambling sequences 246 that were used to descramble the descrambled REs 244. The processor 502 uses the RE information 236 to determine which REs represent UCI values. For example, the RE information 236 comprises indexed and categorized RE information so that the processor 502 can use this information to determine when selected UCI REs are received.

At the start of a symbol, the processor 502 initializes ACK 508, CSI1 510, and eleven (0-10) hypothesis CSI2 512 values in the memory 504. When REs containing ACK and CSI1 information are received, the processor 502 combines this information with values currently in the memory 504. For example, the processor 502 uses the RE1 information 236 to determine when ACK information bits are received and combines these bits with currently stored ACK bits 508. This process continues for ACK 508 and CSI1 510.

When CSI2 information is received, the 512, the hypothesis processor 516 operates to determine one of the hypotheses 512 in which to accumulate the CSI2 information. A more detailed description of the operation of the hypothesis processor 516 is provided below.

Once all the REs of a symbol have been received, the combined values are written out to an external memory 514. Prior to the start of the next symbol, the values in the external memory 514 are returned to the processor 502 and restored to the internal storage 504. Combining of the UCI values of the next symbol is then performed.

After the UCI information in each symbol is combined, the results are stored in the external memory 514. The process continues until the UCI information from a selected number of symbols has been combined. Once the combining process is completed, the processor 502 outputs the combined results 506 to a decoder.

Figure 5B:
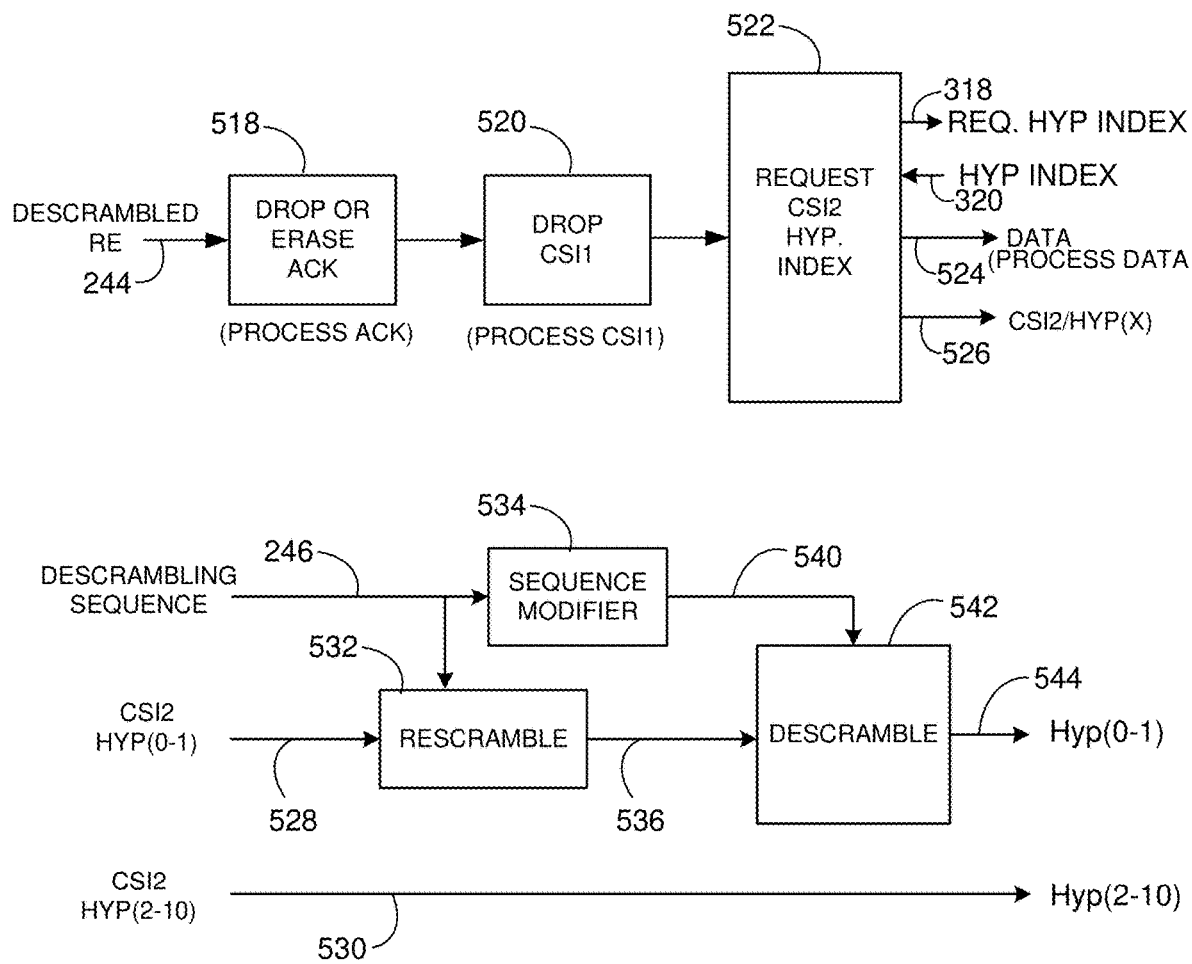
FIG. 5B shows a block diagram illustrating operations performed by the combiner/extractor shown in FIG. 5A.

FIG. 5B shows a block diagram illustrating operations performed by the combiner/extractor 220 shown in FIG. 5A. In an embodiment, the hypothesis processor 516 receives the descrambled RE stream 244 and the descrambling sequences 246 used to descramble the REs of the descrambled stream. The processor 516 drops or erases ACK information (indicated at 518) from the descrambled stream 416 to generate a stream that includes only CSI1 and data/CSI2 information. Next the processor 516 drops CSI1 information (indicated at 520) from the stream to generate the stream that includes only data/CSI2 information. The processor 516 then performs function 522 to identify hypotheses that are associated with the data/CSI2 stream. For example, the processor 516 sends out the request 318 to the RE identifier 232 to identify a hypothesis index value associated with data/CSI2 information. The RE identifier 232 returns identifying information that indicates whether or not the data/CSI2 information comprises data or CSI2 information. If the information contains data, then the data 524 is output for further processing. If the information contains CSI2, then the hypothesis index is received that indicates the hypothesis associated with the CSI2 information. The CSI2 information and its hypothesis 526 are then further processed.

The hypothesis processor 516 receives the CSI2/Hyp 526 and performs further processing. If the hypothesis is in the range of (2-10) as indicated at 530, the CSI2 information is passed for accumulation in the memory 504. If the hypothesis is in the range of (0-1), the CSI2 value is input to a rescrambling function 532 that uses the received descrambling sequence 246 to rescramble the CSI2 information to recover the CSI2 information 536 prior to descrambling. The descrambling sequence 246 is modified by modifier function 534 to generate a modified descrambling sequence 540. The modified descrambling sequence 540 is used by a descrambling function 542 to descramble the rescrambled CSI2 information 536 to generate modified descrambled CSI2 information 544. The modified CSI2 information is passed for accumulation in the memory 504.

Combined Soft Output for UCI

In an exemplary embodiment, the output for UCI soft-combining can be summarized as follows.

1-Bit UCI Case
  A. 1 soft-combined UCI output with 16-bit bitwidth
  B. 1 soft-combined 'x' labeled bit output with 16-bit bitwidth for ACK and only for 16QAM, 64QAM, and 256QAM.
    struct UCI_REPORT_1BIT {int16_t
      uci_soft_combined;
      int16_t uci_x_soft_combined;//valid only for ACK and 16QAM, 64QAM, 256QAM
      int16_t reserved [30];
    }

For 2-Bit UCI Case
  A. 3 soft-combined UCI output for 2-bit UCI case with 16-bit bitwidth
  B. 1 soft-combined 'x' labeled bit output with 16-bit bitwidth for ACK and only for 16QAM, 64QAM, and 256QAM
    struct UCI_REPORT_2BIT {
      int16_t uci_soft_combined[3];// c0, c1, c2
      int16_t uci_x_soft_combined;// valid only for ACK and 16QAM, 64QAM, 256QAM
      int16_t reserved[28];
    }

For RM Encoding (3<OUCI<11) Case
  A. 1 set of 32 soft-combined UCI output with 16-bit bitwidth as an input to the RM decoder.
    struct UCI_REPORT_RM {int16_t
      uci_soft_combined [32];
    }

CSI2 Case

In an exemplary embodiment, there will be up to 11 soft-combined results in total each corresponding to a hypothesis. The soft combining methodology for each hypothesis is fixed and given in Table 2 below.

TABLE 2

| CSI2 soft-combining per hypothesis | |
| --- | --- |
| Hypothesis # | Soft combining method |
| Hypothesis 0 | 1-bit soft combining |
| Hypothesis 1 | 2-bit soft combining |
| Hypothesis 2 to Hypothesis 10 | Reed muller (RM) soft combining |

Note that LLR modification may be required for hypothesis 0 and hypothesis 1 due to the presence of 'x' and 'y' bits depending upon the modulation type and the scrambling sequence prior to soft combining operation. This is illustrated in Table 3 below.

TABLE 3

| CSI2 combining example for multiple hypothesis | | | | |
| --- | --- | --- | --- | --- |
| | Scrambling seq | Hypo0 | Hypo1 | Hypo2-Hypo 10 |
| CSI2 RE | llr0 | 1 | 1 | 1 | 1 |
| | llr1 | −1 | 1* | −1 | −1 |
| | llr2 | −1 | 1* | 1* | −1 |
| | llr3 | 1 | 1* | 1* | 1 |
| | Stream out along with data | 1-bit combiner input | 2-bit combiner input | RM combiner input |
| | llr0 | llr0 | llr0 | llr0 |
| | −llr1 | llr1 | −llr1 | −llr1 |
| | −llr2 | llr2 | llr2 | −llr2 |
| | llr3 | llr3 | llr3 | llr3 |

*denotes x/y bit modification

Figure 6:
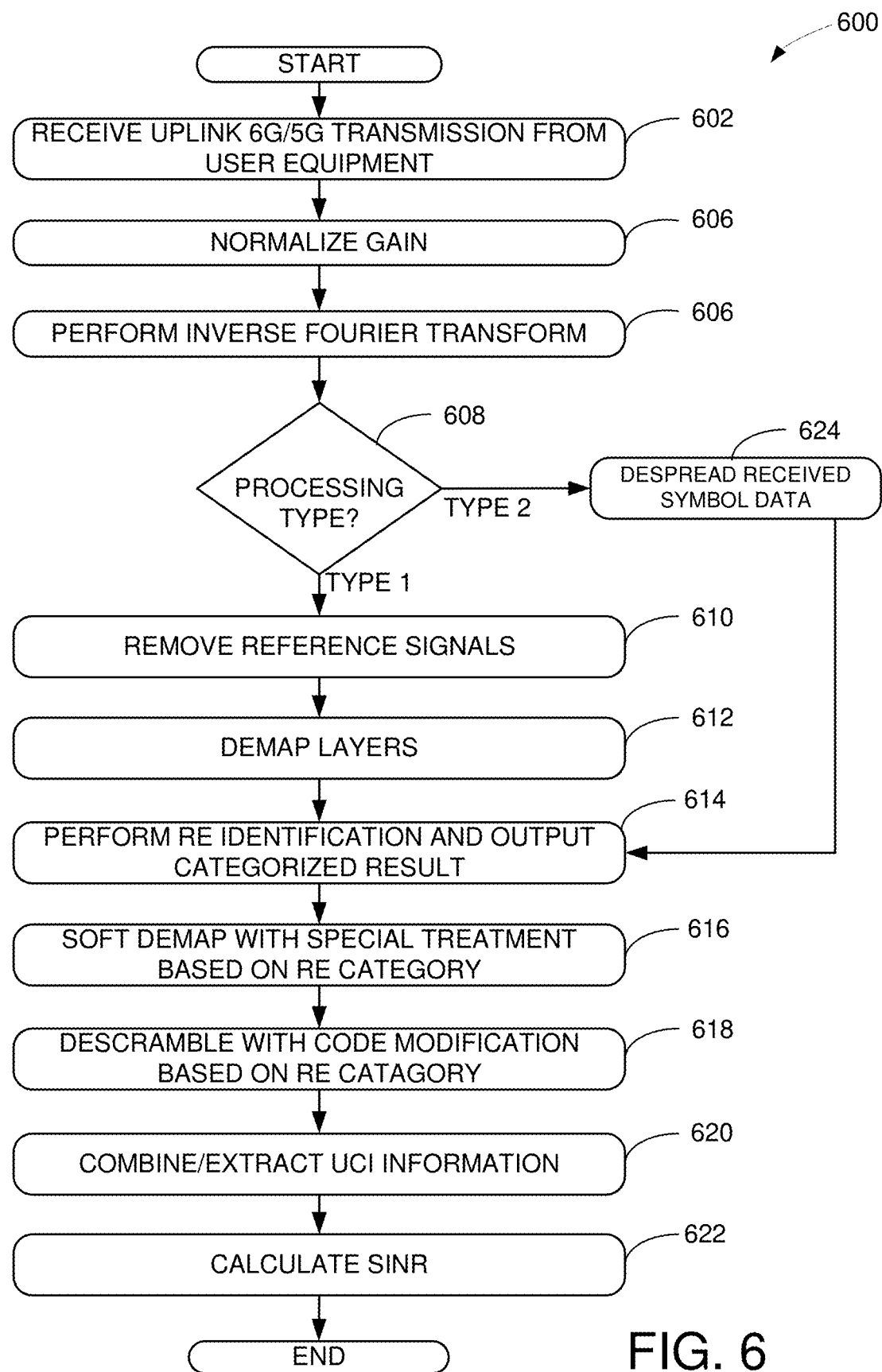
FIG. 6 shows an exemplary method for performing resource element categorization in accordance with exemplary embodiments of a resource element identification system.

FIG. 6 shows an exemplary method 600 for performing resource element categorization in accordance with exemplary embodiments of an RE1 system. For example, the method 600 is suitable for use with the RE1 system 152 shown in FIG. 2.

At block 602, uplink transmissions are received in a 5G communication network. For example, the uplink transmissions are received at the front end 228 shown in FIG. 2.

At block 604, gain normalization is performed. For example, the gain normalization is performed by the gain normalizer 202 shown in FIG. 2.

At block 606, an inverse Fourier transform is performed to obtain time domain signals. For example, this process is performed by the IDFT block 204 shown in FIG. 2.

At block 608, a determination is made as to a type of processing to be performed. For example, a description of two processing types is provided above. If a first type of processing is to be performed, the method proceeds to block 610. If a second type of processing is to be performed, the method proceeds to block 624. For example, this operation is performed by the processing type detector 208 shown in FIG. 2.

At block 624, when the processing type is Type 2, despreading is performed on the received resource elements. For example, this operation is performed by the despreader 214 shown in FIG. 2. The method then proceeds to block 614.

When the processing type is Type 1, the follow operations are performed.

At block 610, the reference signals are removed from the received resource elements. For example, resource elements containing RS/DTX are removed. This operation is performed by the RS remover 210 shown in FIG. 2.

At block 612, layer demapping is performed. For example, the resource elements without RS/DTX are layer demapped. This operation is performed by the layer demapper 212.

At block 614, RE identification and categorization is performed. For example, as illustrated in FIG. 3, the RE identifier 232 receives a stream of REs, categorizes the REs, and then outputs the array 316 in which the REs are indexed and include categorization values.

At block 616, soft-demapping is performed. For example, the soft-demapper 216 soft-demaps the REs with special treatment provided based on the categorization of the received REs. The soft-demapper 216 produces a soft-demapped output that is input to the descrambler 218.

At block 618, descrambling is performed. For example, the descrambler 218 receives the soft-demapped bits from the soft-demapper 216 and generates descrambled bits. In an embodiment, based on the categorization of the REs, a modified descrambler code is used. In an embodiment, the descrambler 218 operates to save LFSR state between symbols so that continuous descrambling code generation can be provided from symbol to symbol.

At block 620, combining and extraction of UCI information is performed. For example, the combiner/extractor 220 receives the descrambled bits, combines these bits, and extracts the UCI information. For example, the combiner/extractor 220 utilizes the RE categorization information to identify UCI resource elements and combines these elements into the memory 504. The combined UCI values are output at the end of the symbol and the memory is reinitialized for the combining UCI of the next symbol.

At block 622, SINR calculations are performed to calculate data/CSI2, ACK, and CSI1 SINR values.

Thus, the method 600 operates to provide resource element identification and categorization in accordance with the exemplary embodiments. It should be noted that the operations of the method 600 could be modified, added to, deleted, rearranged, or otherwise changed within the scope of the embodiments.

Figure 7:
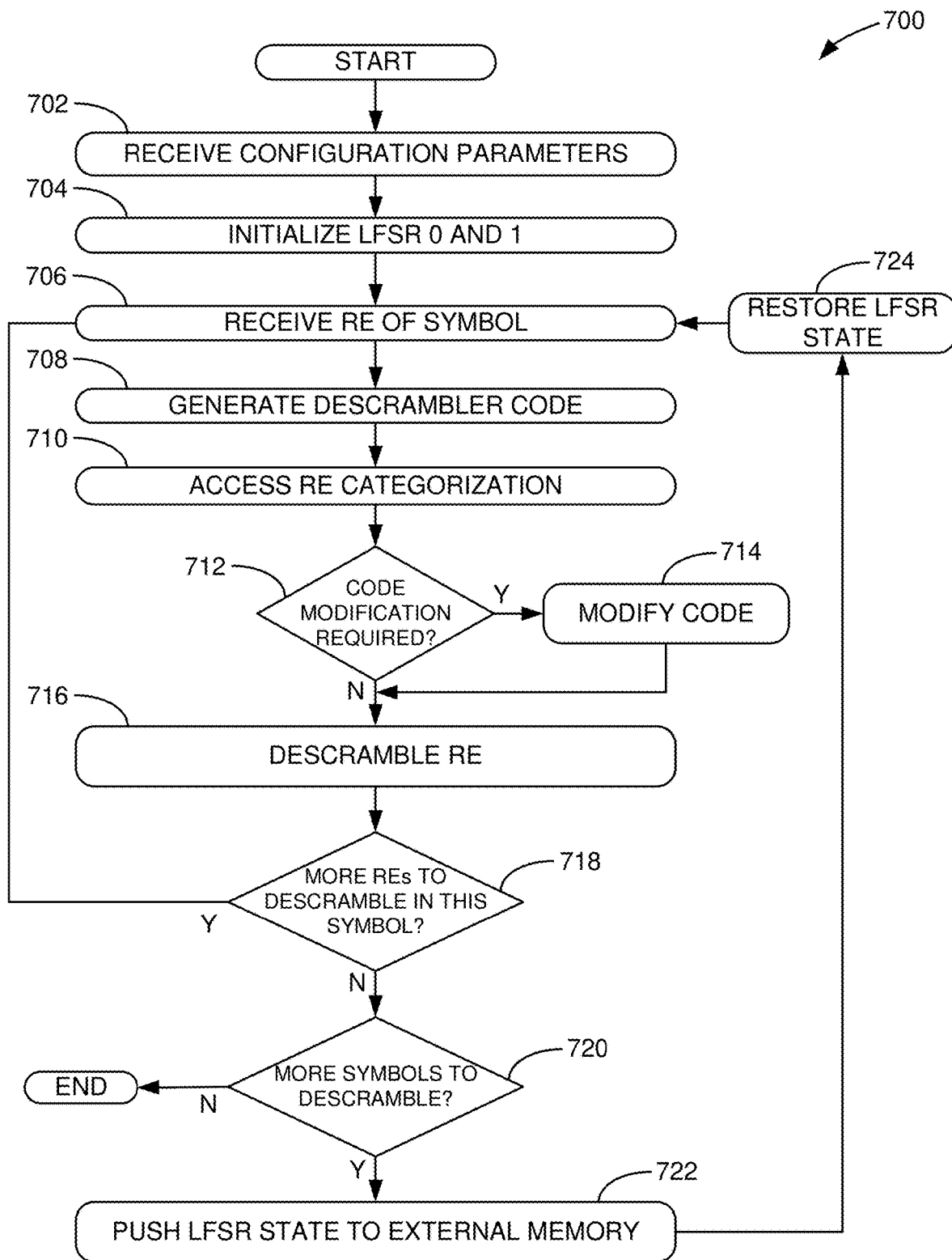
FIG. 7 shows an exemplary method for performing descrambling in accordance with exemplary embodiments of a descrambling and combining system.

FIG. 7 shows an exemplary method 700 for performing descrambling in accordance with exemplary embodiments of a descrambling and combining system. For example, the method 700 is suitable for use with the DCS 154 shown in FIG. 2.

At block 702, configuration parameters and initialization values are received by the descrambler 218. For example, the configuration parameters 222 are received by the descrambler processor 402. In addition, the initialization values 416 are received by the descrambler processor 402. In an embodiment, the initialization values 416 are received from a central processing entity at the receiver. In another embodiment, the initialization values 416 are LFSR state information received from the external memory 414.

At block 704, one or more linear feedback shift registers are initialized. For example, the processor 402 initializes the registers LFSR0 and LFSR1 with initialization values INIT0 408 and INIT1 410, respectively.

At block 706, a resource element of a symbol is received. For example, the processor 402 receives a resource element of the symbol S0 as shown in FIG. 4B.

At block 708, a descrambling code is generated. For example, the processor 402 generates the descrambling code based on the output of the shift registers LFSR0 and LFSR1.

At block 710, the RE information is accessed by the processor to determine information about the current resource element. For example, the processor 402 accesses information about the current resource element based on the RE information 236 and the parameters 222.

At block 712, a determination is made as to whether scrambling code modification should be made. For example, the processor 402 determines if a descrambling code modification is needed to descramble the current resource element based on the RE information 236 and the parameters 222. If modification of the scrambling code is needed, the method proceeds to block 714. If no modification is needed, the method proceeds to block 716.

At block 714, the scrambling code is modified by the processor 402 as necessary. For example, the sequence modifier 412 modifies the scrambling code for certain types of ACK and CSI1 information.

At block 716, the RE is descrambled using the scrambling code. For example, the processor 402 descrambles the RE using the current scrambling code.

At block 718, a determination is made as to whether there are more REs in the current symbol to descramble. For example, the processor 402 makes this determination from the configuration parameters 222 and/or the RE information 236. If there are no more symbols to descramble, the method proceeds to block 720. If there are more symbols to descramble in the current symbol, the method proceeds to block 706.

At block 720, a determination is made as to whether there are more symbols to descramble. For example, the processor 402 makes this determination from the configuration parameters 222 and/or the RE information 236. If there are no more symbols to descramble, the method ends. If there are more symbols to descramble, the method proceeds to block 722.

At block 722, the LFSR state is stored. For example, the processor 402 pushes the current state of the registers LFSR0 and LFSR1 to the external memory 414, for example, as shown by 422.

At block 724, the LFSR state is restored prior to descrambling the next symbol. For example, the stored LFSR state from the memory 414 is provided to the processor 402 as a new set of initialization values 416 that are used to restore the state of the registers LFSR0 and LFSR1. Thus, the LFSR generates descrambling sequences based on the restored state. The method then proceeds to block 706 where descrambling continues until the desired number of symbols have been descrambled.

Thus, the method 700 operates to provide descrambling in accordance with exemplary embodiments of a descrambling and combining system. It should be noted that the operations of the method 700 could be modified, added to, deleted, rearranged, or otherwise changed within the scope of the embodiments.

Figure 8:
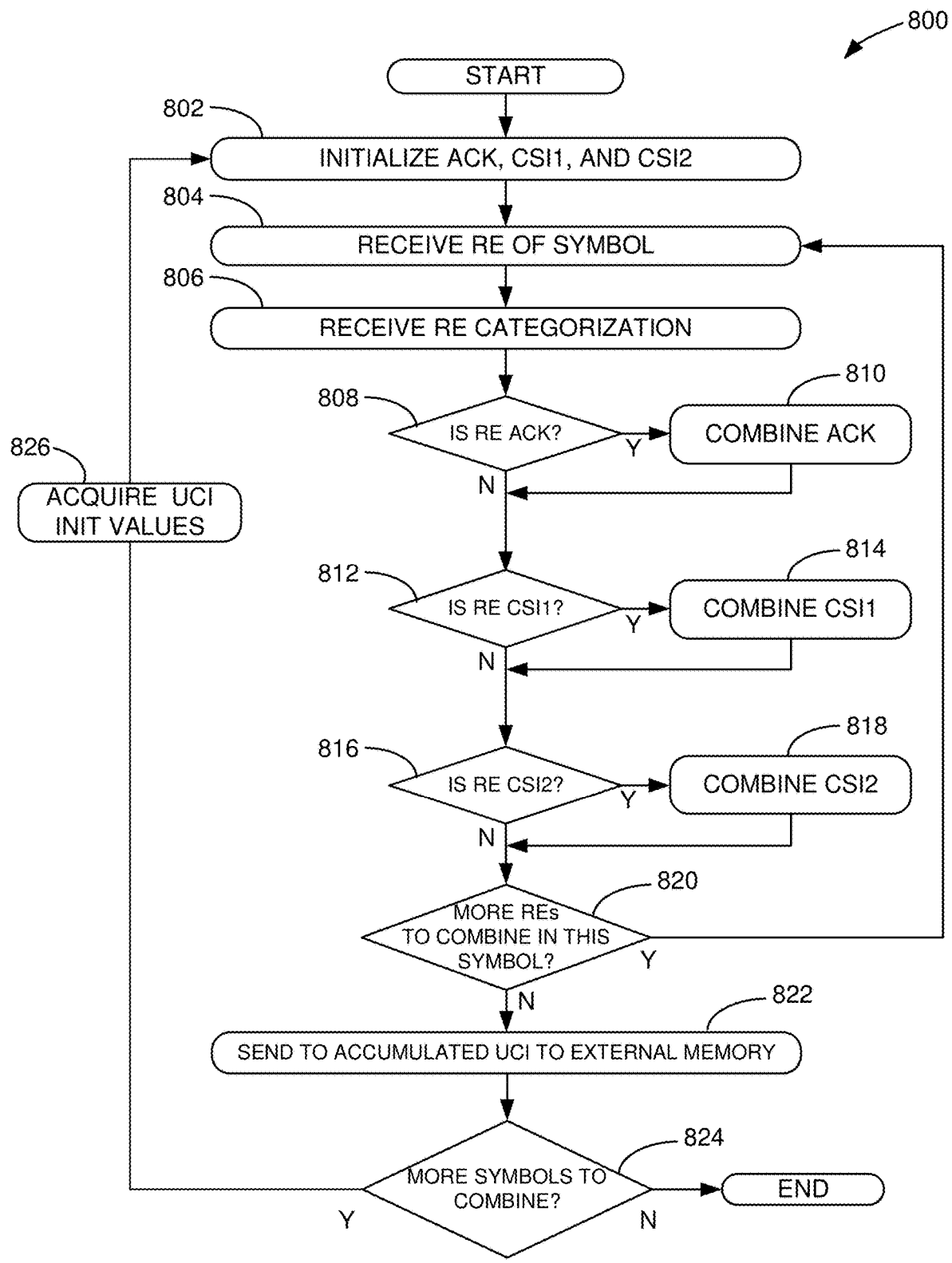
FIG. 8 shows an exemplary method for performing combining in accordance with exemplary embodiments of a descrambling and combining system.

FIG. 8 shows an exemplary method 800 for performing combining in accordance with exemplary embodiments of a descrambling and combining system. For example, the method 800 is suitable for use with the DCS 154 shown in FIG. 2.

At block 802, initialization of ACK, CSI1, and CSI2 values in a memory is performed. For example, in an embodiment, the processor 502 initializes the values of ACK 508, CSI1 510, and CSI2 512 in the memory 504.

At block 804, a descrambled RE of a symbol is received. For example, the processor 502 receives the descrambled RE 244.

At block 806, RE categorization information is received. For example, the processor 502 receives the RE information 236.

At block 808, a determination is made as to whether the current RE contains an ACK value. The processor 502 makes this determination from the RE information 236. If the current RE contains an ACK value the method proceeds to block 810. If the current RE does not contain an ACK value, the method proceeds to block 812.

At block 810, the ACK value contained in the current RE is combined with ACK values in memory. For example, the processor 502 combines the current RE value with the stored ACK value 508 and restores the combined value back into the memory 504.

At block 812, a determination is made as to whether the current RE contains a CSI1 value. The processor 502 makes this determination from the RE information 236. If the current RE contains a CSI1 value the method proceeds to block 814. If the current RE does not contain a CSI1 value, the method proceeds to block 816.

At block 814, the CSI1 value contained in the current RE is combined with CSI1 values in memory. For example, the processor 502 combines the current RE value with the stored CSI1 value 510 and restores the combined value back into the memory 504.

At block 816, a determination is made as to whether the current RE contains a CSI2 value. The processor 502 makes this determination from the RE information 236. If the current RE contains a CSI2 value the method proceeds to block 818. If the current RE does not contain a CSI2 value, the method proceeds to block 820.

At block 818, the CSI2 value contained in the current RE is combined with CSI2 values in memory. For example, the processor 502 combines the current RE value with the one of the stored hypothesis CSI2 values 512 and restores the combined value back into the memory 504. A detailed description of the combining of CSI2 values is provided with respect to FIGS. 9A-B.

At block 820, a determination is made as to whether there are more REs to combine in the current symbol. The processor 502 makes this determination from the RE information 236. If there are more REs to combine, the method proceeds to block 804. If there are no more REs to combine, the method proceeds to block 822.

At block 822, the accumulated UCI values are pushed to an external memory. For example, the accumulated UCI values are pushed to the external memory 514.

At block 824, a determination is made as to whether there are more symbols to combine. In an embodiment, the processor 502 makes this determination from the RE1 information 236. If there are no more symbols to combine, the method ends. If there are more symbols to combine, the method proceeds to block 826.

At block 826, the UCI values stored in the external memory are acquired and input to the processor 502 as new initialization values. For example, the accumulated UCI values stored in the external memory 514 are acquired by the processor 502. The method then proceeds to block 802 where the acquired UCI values from the external memory are used to initialize the UCI values 508, 510, and 512 in the internal storage 504.

Thus, the method 800 operates to provide combining in accordance with exemplary embodiments of a descrambling and combining system. It should be noted that the operations of the method 800 could be modified, added to, deleted, rearranged, or otherwise changed within the scope of the embodiments.

Figure 9A:
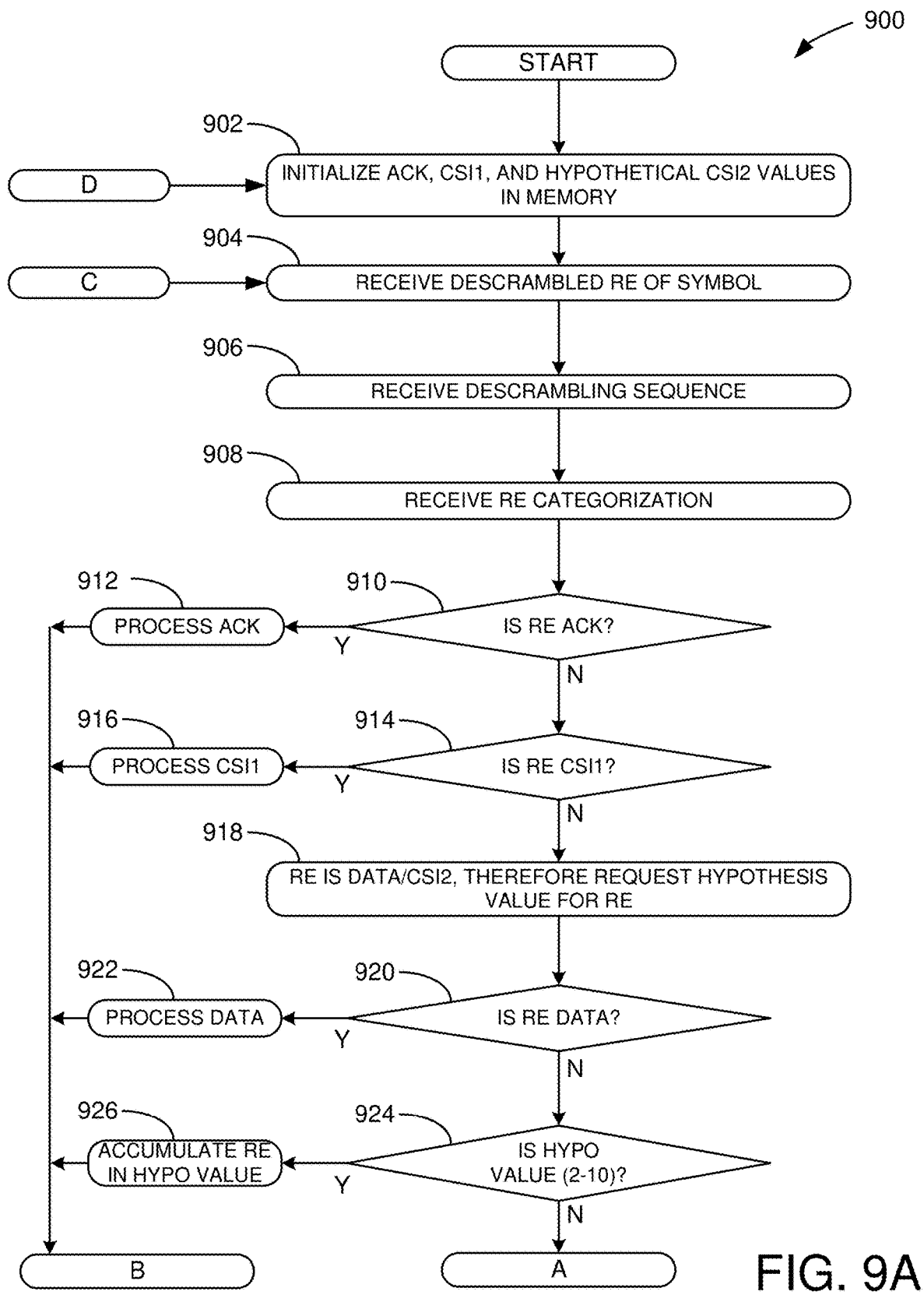
FIGS. 9A-B shows an exemplary method for performing combining in accordance with exemplary embodiments of a descrambling and combining system.
Figure 9B:
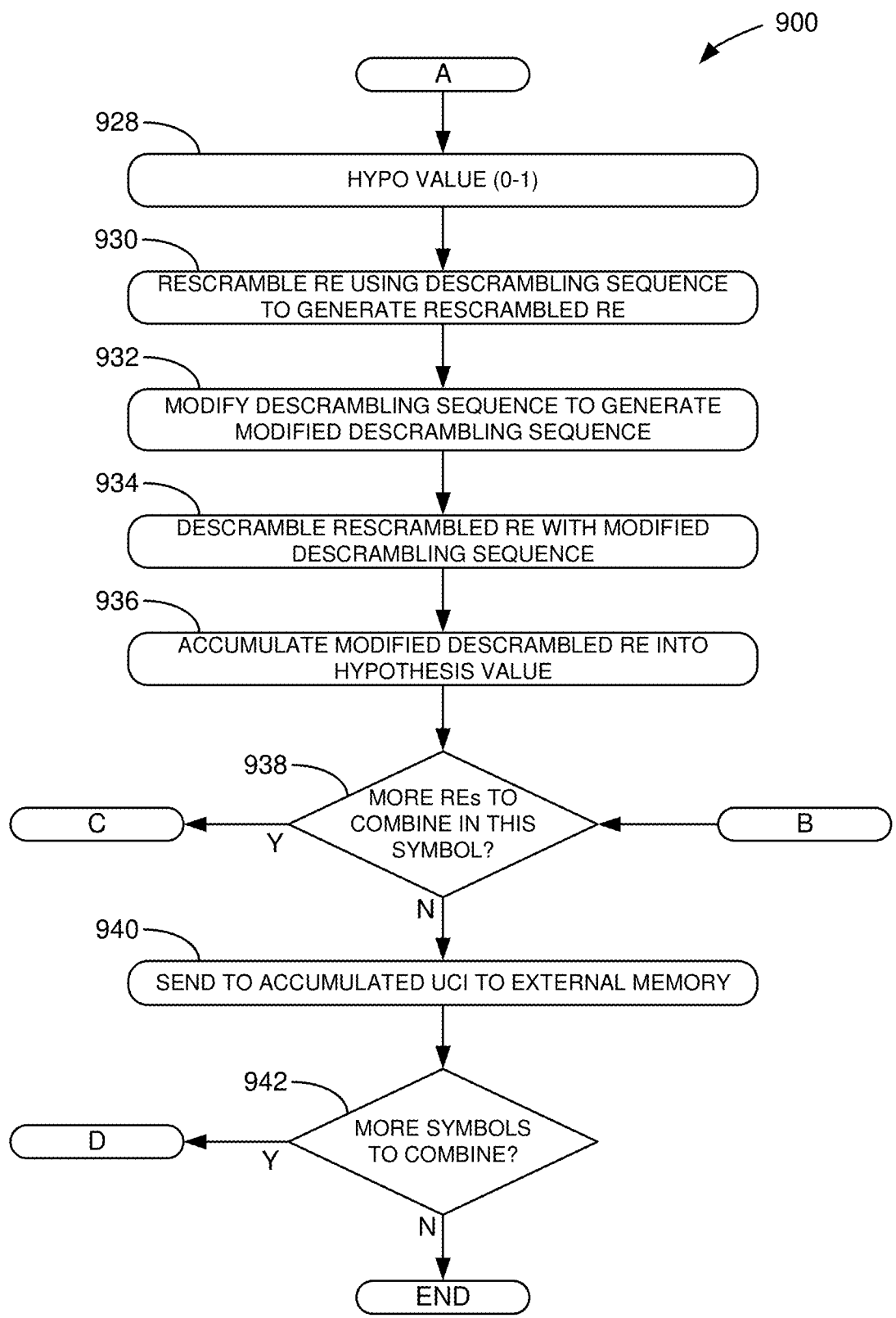

FIGS. 9A-B shows an exemplary method 900 for performing combining in accordance with exemplary embodiments of a descrambling and combining system. For example, the method 900 is suitable for use with the DCS 154 shown in FIG. 2.

Referring now to FIG. 9A, at block 902, initialization is performed for ACK, CSI1, and eleven hypothesis CSI2 values stored in a memory. For example, in an embodiment, the processor 502 initializes the ACK 508, CSI1 510, and eleven hypothesis CSI2 values 512 in the memory 504. In an embodiment, the values used to initialize the memory 504 are received from the external memory 514 (indicated by D).

At block 904, a descrambled RE of a symbol is received. For example, the processor 502 receives the descrambled RE 244.

At block 906, a descrambled sequence is received. For example, the processor 502 receives the descrambling sequence 246.

At block 908, RE categorization information is received. For example, the processor 502 receives the RE information 236.

At block 910, a determination is made as to whether the RE is an ACK value. If the received RE is an ACK value, the method proceeds to block 912. If the received RE is not an ACK value, the method proceeds to block 914.

At block 912, ACK processing is performed as described in other sections of this document. The method then proceeds to block 938 (indicated by B).

At block 914, a determination is made as to whether the RE is a CSI1 value. If the received RE is a CSI1 value, the method proceeds to block 916. If the received RE is not a CSI1 value, the method proceeds to block 918.

At block 916, CSI1 processing is performed as described in other sections of this document. The method then proceeds to block 938 (indicated by B).

At block 918, the RE comprises data/CSI2 and therefore a request for a hypothesis value for the RE is generated. For example, the processor 516 outputs the request 318 to the RE identifier 232 to obtain a hypothesis index valued for the data/CSI2 information. In one embodiment, the response 320 generated by the RE identifier 232 indicates that the data/CSI2 information is data. In one embodiment, the response 320 generated by the RE identifier 232 indicates that the data/CSI2 information is CSI2 information associated with a selected hypothesis value (e.g., x).

At block 920, a determination is made as to whether the data/CSI2 information is data. If the response from the RE identifier 232 indicates that the data/CSI2 information is data, the method proceeds to block 922. If not, the method proceeds to block 924.

At block 922, the data is processed as described in other sections of this document. The method then proceeds to block 938 (indicated by B).

At block 924, a determination is made as to whether the hypothesis index associated with the CSI2 information is in the range of (2-10). If the hypothesis index is in the range of (2-10), the method proceeds to block 926. If not, the method proceeds to block 928 (indicated by A).

At block 926, the CSI2 information is accumulated with the appropriate CSI2 information in the memory 504 based on the hypothesis value, as described in other sections of this document. The method then proceeds to block 936 (indicated by B).

Referring now to FIG. 9B, at block 928, the current CSI2 information is identified to be associated with either hypothesis 0 or 1.

At block 930, the CSI2 RE is rescrambled using the received descrambling sequence. For example, the processor 516 uses the received descrambling sequence 246 to rescramble the received scrambled CSI2 RE 528 to generate a rescrambled CSI2 RE 536.

At block 932, the descrambling sequence 246 is modified to generate a modified descrambling sequence. The processor 516 performs a modifying function 534 to modify the received descrambling sequence 246 to generate the modified descrambling sequence 540.

At block 934, the rescrambled RE is descrambled with the modified descrambling sequence to generate a modified descrambled RE. For example, the processor 516 performs a descrambling function 542 to descramble the rescrambled CSI2 RE 536 to generate the modified descrambled CSI2 RE 544.

At block 936, the modified descrambled CSI2 RE 544 is accumulated with the appropriate hypothesis value in the memory 504.

At block 938, a determination is made as to whether there are more REs to combine in the current symbol. The processor 502 makes this determination from the RE information 236. If there are more REs to combine, the method proceeds to block 904 (indicated by C). If there are no more REs to combine, the method proceeds to block 940.

At block 940, the accumulated UCI values in the memory 504 are stored in the external memory 514.

At block 942, a determination is made as to whether there are more symbols having UCI information to be combined. If there are more symbols having UCI information to be combined (e.g., in the slot or subframe), the method proceeds to block 902 (indicated by D). In this path, the information stored in the external memory 514 is used to initialize the values stored in the memory 504 prior to combining information from additional symbols. If there are no more symbols to combine, the method ends.

Thus, the method 900 operates to provide combining in accordance with exemplary embodiments of a descrambling and combining system. It should be noted that the operations of the method 900 could be modified, added to, deleted, rearranged, or otherwise changed within the scope of the embodiments.

Figure 10A:
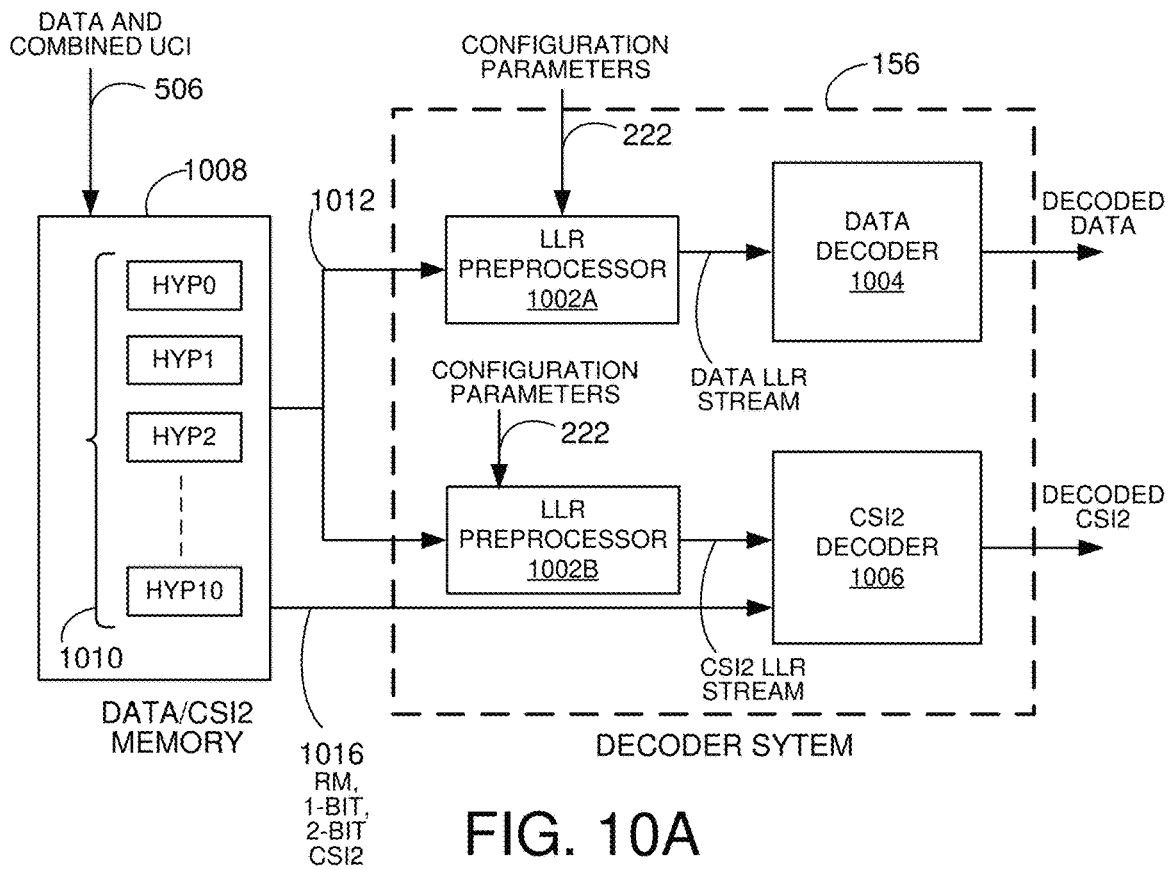
FIG. 10A shows an exemplary block diagram of a decoder system.

FIG. 10A shows an exemplary block diagram of the decoder system 156. In an embodiment, the decoder system 156 comprises an LLR preprocessors 1002A-B, data decoder 1004, and CSI2 decoder 1006. Also shown in FIG. 10 is memory 1008. In an embodiment, the memory 1008 receives the combined data and UCI information 506 from the combiner/extractor processor 502 shown in FIG. 5. For example, the memory 1008 receives combined hypothetical CSI2 values 1010 and outputs these values in an LLR stream 1012 to the decoder system 156.

In 5G or NR, data and UCI LLRs are multiplexed in both time and frequency. UCI is composed of CSI1/CSI2 and ACK fields. In an embodiment, CSI1 and ACK LLRs can be separated and/or removed from the LLR stream. However, the CSI2 LLRs cannot be separated before producing the composite output LLR stream 1012 provided as input to the decoder system 156. To extract the required LLRs from this composite stream, the LLR pre-processors 1002A-B perform this operation. For example, in one case, the preprocessor 1002A extracts the data LLRs from the stream 1012 and drops the remaining LLRs to form a data LLR stream.

In another case, the preprocessor 1002B extracts the CSI2 LLRs and drops the remaining LLRs to form a CSI2 LLR stream.

In an embodiment, the data decoder 1004 decodes the data LLR stream to generate decoded data. The CSI2 decoder 1006 decodes the CSI2 LLR stream to generate decoded CSI2 information. In another embodiment, Reed Muller (RM), 1-bit, or 2-bit encoded CSI2 LLRs (indicated at 1016) are provided directly to the CSI2 decoder 1006.

Figure 10B:
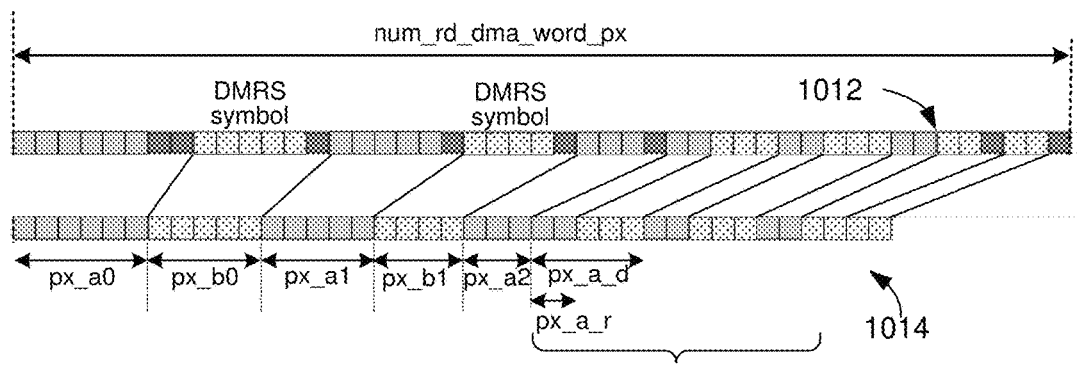
FIG. 10B shows an exemplary detailed diagram illustrating an embodiment of an LLR stream that is input to the decoder system shown in FIG. 10A.

FIG. 10B shows an exemplary detailed diagram illustrating an embodiment of the LLR stream 1012 that is input to the decoder system 156 in accordance with one embodiment of the present invention. The LLR stream 1012 includes LLRs for CSI2, LLRs for data, and padding LLRs, which are identified in FIG. 10B by their respective shading. In an embodiment, the LLR preprocessors 1002A-B perform an algorithm to remove the padding LLRs to generate a second stream 1014 that contains LLRs for data and CSI2. For example, after the padding LLRs are dropped by the preprocessors 1002A-B, the remaining LLR stream follows a pattern as shown in the stream 1014.

In an embodiment, there can be up to 3 bursts of CSI2 LLRs and up to 2 bursts of data LLRs alternating with each other in each half slot. Each burst of data LLRs corresponds to a set of data LLRs in a DMRS symbol. In the frequency hopping case, there can be up to 2 DMRS symbols in each half slot and hence two bursts of data LLRs are possible. Each burst of CSI2 LLRs corresponds to a consecutive group of CSI2 LLRs not interrupted by data LLRs.

The burst sizes of CSI2 LLRs are represented by px_a0, px_a1, and px_a2. And the burst sizes of data LLRs are represented by px_b0 and p1_b1, respectively. Following these CSI2 and data bursts, there can be periodic and alternating CSI2 and data LLRs repeating "a_k" times. Each period starts with CSI2 of length "px_a_r" LLRs followed by data of length "px_a_d-px_a_r" LLRs. Following this periodic pattern, the rest will be data LLRs until the end of 'num_rd_dma_word_px'. Overall, these bursts are repeated twice. For example, px becomes p0 for part 0 and p1 for part 1.

Configuration

In an embodiment, the following configuration parameters 222 shown in Table 4 below are used for the operation of the LLR preprocessors 1002A-B to separate the data and CSI2 LLRs. These parameters will be present in the AB_CFG section of LDPC decoder (LDEC) and polar decoder (PDEC) blocks of the configuration parameters 222. It is not necessary for all these parameters to show up in the same 64-bit word or in consecutive words.

TABLE 4

Configuration parameters

| | Parameter | Width | Description |
|---|---|---|---|
| 1 | preproc_mode | 1 | '0': Pass CSI2 LLRs and drop rest<br>'1': Pass data LLRs and drop rest |
| 2 | preproc_p0_csi2_len0 | 19 | CSI2 part 0-burst 0 size. Range: [0:422399] |
| 3 | preproc_p0_csi2_len1 | 19 | CSI2 part 0-burst 1 size. Range: [0:422399] |
| 4 | preproc_p0_csi2_len2 | 19 | CSI2 part 0-burst 2 size. Range: [0:422399] |
| 5 | preproc_p1_csi2_len0 | 19 | CSI2 part 1-burst 0 size. Range: [0:422399] |
| 6 | preproc_p1_csi2_len1 | 19 | CSI2 part 1-burst 1 size. Range: [0:422399] |
| 7 | preproc_p1_csi2_len2 | 19 | CSI2 part 1-burst 2 size. Range: [0:422399] |
| 8 | preproc_p0_data_len0 | 17 | Data part 0-burst 0 size. Range: [0:105599] |
| 9 | preproc_p0_data_len1 | 17 | Data part 0-burst 1 size. Range: [0:105599] |
| 10 | preproc_p1_data_len0 | 17 | Data part 0-burst 0 size. Range: [0:105599] |
| 11 | preproc_p1_data_len1 | 17 | Data part 0-burst 1 size. Range: [0:105599] |
| 12 | preproc_p0_csi2_repeat_period | 16 | Periodicity of Repeated CSI2 LLRs followed by part 0 (3 bursts of CSI2 and 2 bursts of data) LLRs. Represents number of LLRs of each period. Range: [0:52800] |

TABLE 4-continued

Configuration parameters

| | Parameter | Width | Description |
|---|---|---|---|
| 13 | preproc_p1_csi2_repeat_period | 16 | Periodicity of Repeated CSI2 LLRs followed by part 1 (3 bursts of CSI2 and 2 bursts of data) LLRs. Represents number of LLRs of each period. Range: [0:52800] |
| 14 | preproc_csi2_repeat_burst_size | 6 | Burst size of CSI2 LLRs in each repeat of both part 0 and part 1. Range: {1, 2, 3, 4, 6, 8, 10, 12, 16, 18, 20, 24, 30, 32, 40} |
| 15 | preproc_p0_num_repeat | 11 | Number of periodic repetitions in part 0. Range: [0:2047] |
| 16 | preproc_p1_num_repeat | 11 | Number of periodic repetitions in part 1. Range: [0:2047] |
| 17 | num_rd_dma_words_p0 | 32 | Number of read DMA words for part 0 |
| 18 | num_rd_dma_words_p1 | 32 | Number of read DMA words for part 1 |
| 19 | tb_tx_bit_size | 24 | Number of LLRs to be sent to the decoder core |

LLR Preprocessor Operation

In an exemplary embodiment, the following pseudo-code describes the operation of the LLR pre-processors 1002A-B of the decoding system to separate data and CSI2 LLRs to the appropriate decoder. For example, the pseudo-code below utilizes configuration parameters shown in Table 4 to remove padding (e.g., "tagged") LLRs and separate data and CSI2 LLR from an input stream to generate data and CSI2 streams that are passed to the appropriate decoder.

```
If (preproc_mode==0)
    target='csi2'
else
    target='data'
end
csi2_count='preproc_p0_csi2_len0'
data_count='preproc_PO_data_len0'
Step 0:
    Drop all tagged LLRs.
Step 1: Part 0 Starts
    Read 'csi2_count' csi2 LLRs.
    If target=='csi2'
        pass LLRs to CSI2 decoder
    else
        drop them (remove from stream)
    end
Step 2:
    Read 'data_count' data LLRs.
    If target=='csi2'
        drop them
    else
        pass remaining to data decoder
    end
Step 3:
    Repeat steps 1 and 2 one more time with csi2_count=
        'preproc_p0_csi2_len1' and data count='preproc_p0_
        data_len1'
Step 4:
    Read 'preproc_p0_csi2_len2' csi2 LLRs.
    If target=='csi2'
        pass them to CSI2 decoder
    else
        drop them
    end
Step 5:
    Read 'preproc_csi2_repeat_burst_size' CSI2 LLRS
    If target=='csi2'
        pass them to CSI2 decoder
    else
        drop them
    end
Step 6:
    LLRS Read 'preproc_p0_csi2_repeat_period-preproc_
        p0_csi2_repeat_burst_size' data
    If target=='csi2'
        drop them
    else
        pass them to data decoder
    end
Step 7:
    Repeat steps 5 and 6 'preproc_p0_num_repeat' times
Step 8: Part 0 Ends
    Continue reading rest of data LLRs till 'num_rd_dma_
        words_p0' are read
    If target=='csi2'
        drop them
    else if (num_rd_data_llrs< 'tb_tx_bit_size')//
        Number of data LLRs read so far pass them to decoder
    else
        drop them.
Step 9: Part 1 Starts
    Repeats Step 1 to Step 7 by replacing all 'p0' with 'p1'.
Step 10: Part 1 Ends
    Continue reading rest of data LLRs till 'num_rd_dma_
        words_p0+num_rd_dma_words_p1' are read
    If target=='csi2'
        drop them
    else
        if (num_rd_data_llrs< 'tb_tx_bit_size')
            //Number of data LLRs read so far pass them to decoder
        else
            drop them.
```

Figure 11:
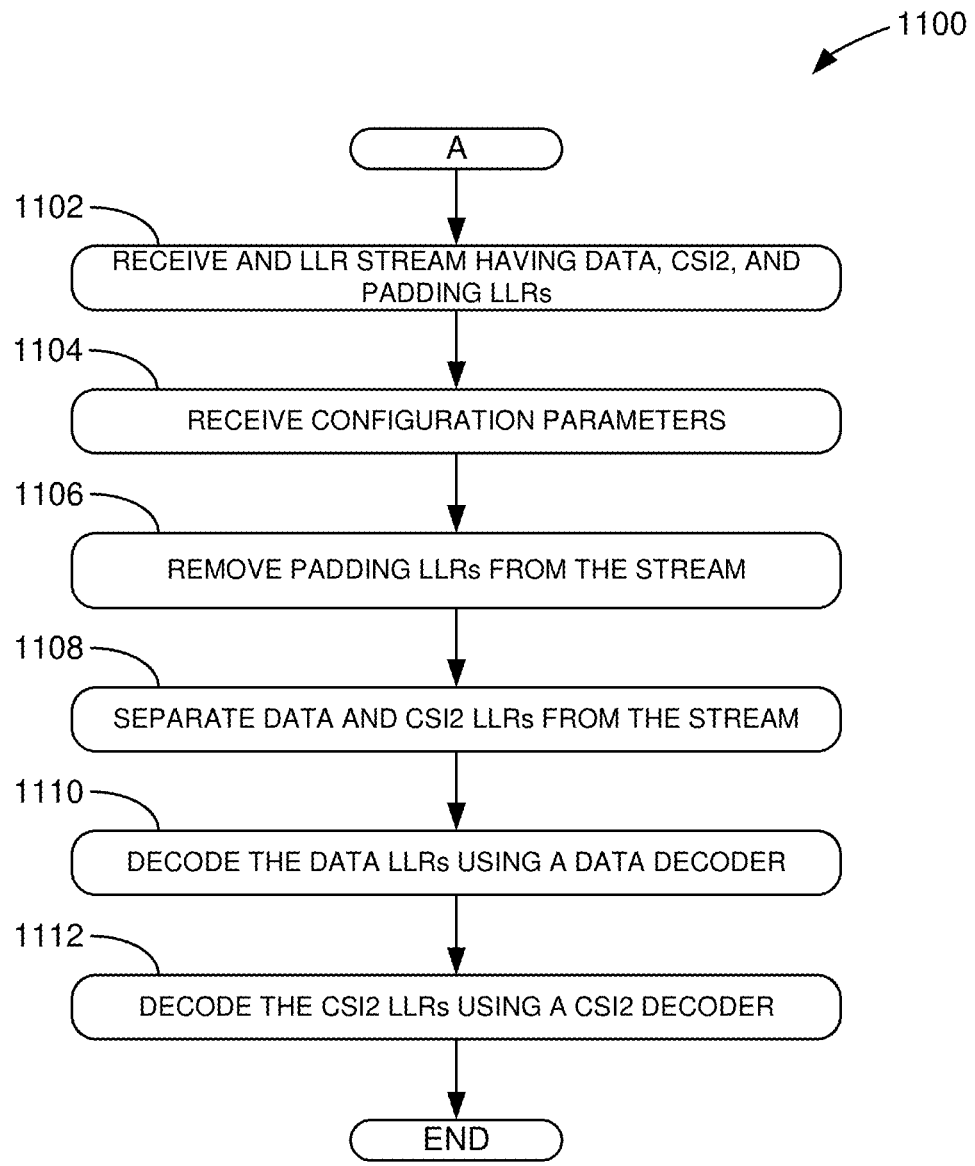
FIG. 11 shows an exemplary method for performing decoding in accordance with exemplary embodiments of a decoder system.

FIG. 11 shows an exemplary method 1100 for performing decoding in accordance with exemplary embodiments of a decoder system. For example, the method 1100 is suitable for use with the decoder system 156 shown in FIG. 2.

At block 1102, a stream of data, CSI2, and padding LLRs are received. For example, in an embodiment, the stream 1012 is received from the memory 1008 by the decoder 156. In an embodiment, both LLR pre-processors 1002A-B receive the stream.

At block 1104, configuration parameters are received. In an embodiment, the configuration parameters 222 are received by the pre-processors 1002A-B.

At block 1106, the padding LLRs are removed from the stream. For example, the pre-processors 1002A-B remove the padding ("tagged") LLRs from the stream they have received.

At block 1108, data and CSI2 LLRs are separated. For example, the pre-processors 1102A-B separates the data and CSI2 LLRs based on the received configuration parameters. For example, each of the LLR preprocessors 1102A-B performs the algorithm above to separate either data or CSI2 LLRs from the stream they have received.

At block 1110, the data LLRs are decoded. For example, the data decoder 1004 receives and decodes the data LLRs.

At block 1112, the CSI2 LLRs are decoded. For example, the CSI2 decoder 1006 receives and decodes the CSI2 LLRs.

Thus, the method 1100 operates to provide decoding in accordance with exemplary embodiments. It should be noted that the operations of the method 1100 could be modified, added to, deleted, rearranged, or otherwise changed within the scope of the embodiments.

LLR Optimization Using Machine Learning

The quality and range of LLRs generated by the LLR generator in 5G systems are important for achieving the best possible physical layer performance. In various embodiments, a machine learning circuit operates to provide parameters to a soft-demapping process of the LLR generator to achieve a selected performance target. In an iterative process, the machine learning algorithm adjusts the soft-demapping parameters based on a measured performance metric to move the system performance toward the selected target performance until the target performance is achieve. The machine learning circuit comprises a parameter table which stores the generated soft-demapping parameters after each iteration. The table also provides storage for soft-demapping parameters that are generated for each of multiple decoders operating with multiple modulation coding schemes.

Figure 12:
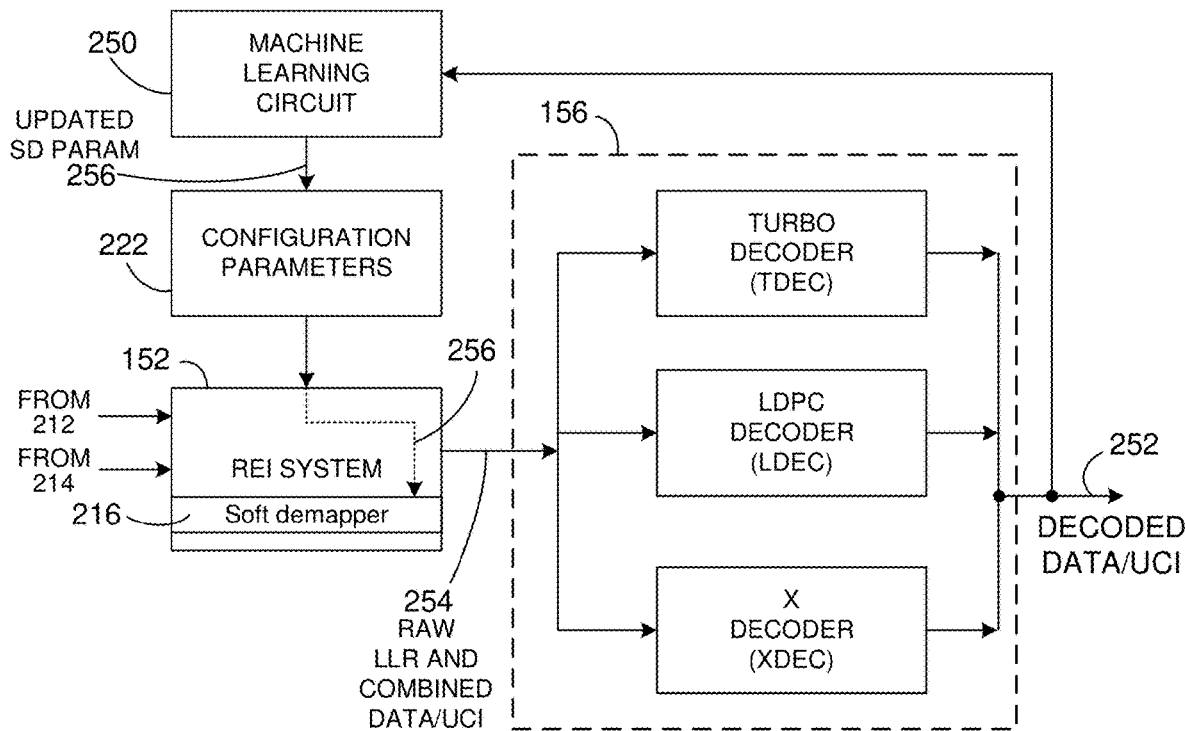
FIG. 12 shows an exemplary embodiment of a portion of the descrambling and combining system shown in FIG. 2.

FIG. 12 shows an exemplary embodiment of a portion of the descrambling and combining system shown in FIG. 2. As illustrated in FIG. 12, the RE1 system 152 generates raw LLRs 254 and includes the soft-demapper 216. The RE1 system 152 receives input from either the layer demapper 212 or the despreader 214 and generates the raw LLRs and combined data/UCI information 254. The RE1 system 152 receives the configuration parameters 222, which are used to control the operation of the various functional blocks of the RE1 system 152 including the soft-demapper 216.

In an embodiment, the configuration parameters 222 include the soft-demapping parameters 256 that are passed to the soft-demapper 216 and are used to control the soft-demapping process. A more detailed description of the soft-demapping parameters 256 is provided below.

In a 5G system, LLRs generated by an LLR generator are fed into one or more decoders. For example, in one embodiment, the decoder 156 comprises a turbo decoder (TDEC) block, an LDPC decoder (LDEC) block, and an X decoder (XDEC) block. Any of the decoder blocks may be utilized to generate the decoded data/UCI output 252. Internal fixed point implementation of all these decoders might be different due to various reasons. In order to ensure the best possible performance from each of these decoders, configuration parameters 222 of the LLR generator are carefully selected.

In an embodiment, the machine learning circuit 250 receives the decoded data/UCI output 252 and determines a performance metric that indicates system performance. In an embodiment, the MLC 250 performs a machine learning algorithm to generate updated soft-demapping parameters 256 that are to be used to adjust the operation of the soft-demapper 216 to move the measured performance toward a desired target performance. In an embodiment, the MLC 250 performs a machine learning algorithm based on a reinforcement learning process to generate the updated parameters 256 to achieve the desired target performance.

Figure 13:
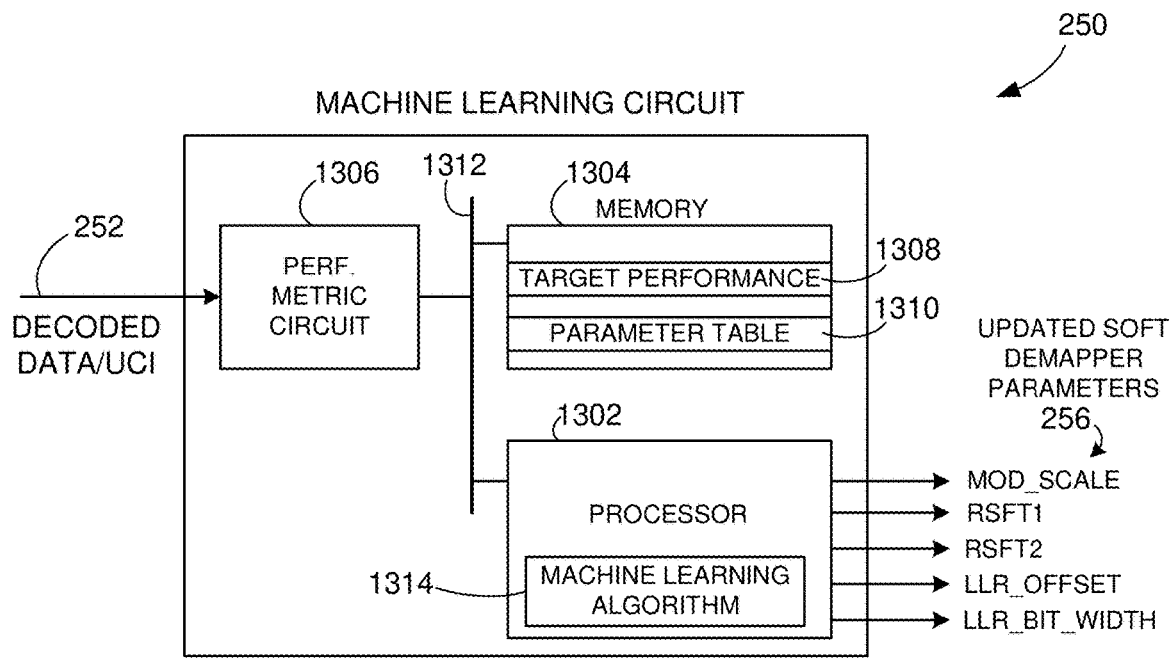
FIG. 13 shows an exemplary detailed embodiment of a machine learning circuit shown in FIG. 12.

FIG. 13 shows an exemplary detailed embodiment of the machine learning circuit 250 shown in FIG. 12. The machine learning circuit 250 comprises a processor 1302, memory 1304, and performance metric circuit 1306 all coupled to communicate over bus 1312. The memory 1304 comprises performance target(s) 1308 and parameter table 1310.

Machine Learning Approach

Machine learning approaches are traditionally divided into broad categories, depending on the nature of the "signal" or "feedback" available to the learning system. In an exemplary embodiment, the machine learning algorithm 1314 performs reinforcement learning to interact with a dynamic environment in which it must perform a certain goal (such adjusting soft-demapper parameters to meet a performance target). As the algorithm navigates the performance space, the algorithm is provided feedback (e.g., a performance metric), which it uses to adjust soft-demapper parameters 256 to move the performance metric toward a performance target 1308.

Various types of models have been used and researched to implement machine learning systems. In an embodiment, the machine learning algorithm 1314 is implemented by an artificial neural network that interconnects group of nodes, akin to the vast network of neurons in a brain. For example, the processor 1302 performs the algorithm 1314 which implements a neural network to perform the operations described herein.

During operation, the performance measurement circuit 1306 receives the decoded data/UCI 252 and determines one or more performance metrics. For example, the performance metrics can include a block error rate (BLER) or any other suitable performance metric. For example, the performance metric can be a minimal SINR needed to achieve a certain BLER, which can be defined by the user, such as a BLER of 10%. The processor 1302 executes the machine learning algorithm 1314 that adjusts parameters in the parameter table 1310 so that subsequent performance metrics move toward the performance target 1308 until the performance target is reached. Thus, the machine learning algorithm 1314 dynamically adjusts the parameters for the soft-demapper 216 to adjust the performance of the system toward the performance target 1308 without manual intervention. In an embodiment, the target performance is a specific performance level or represents a range of performance.

Figures 14, 15:
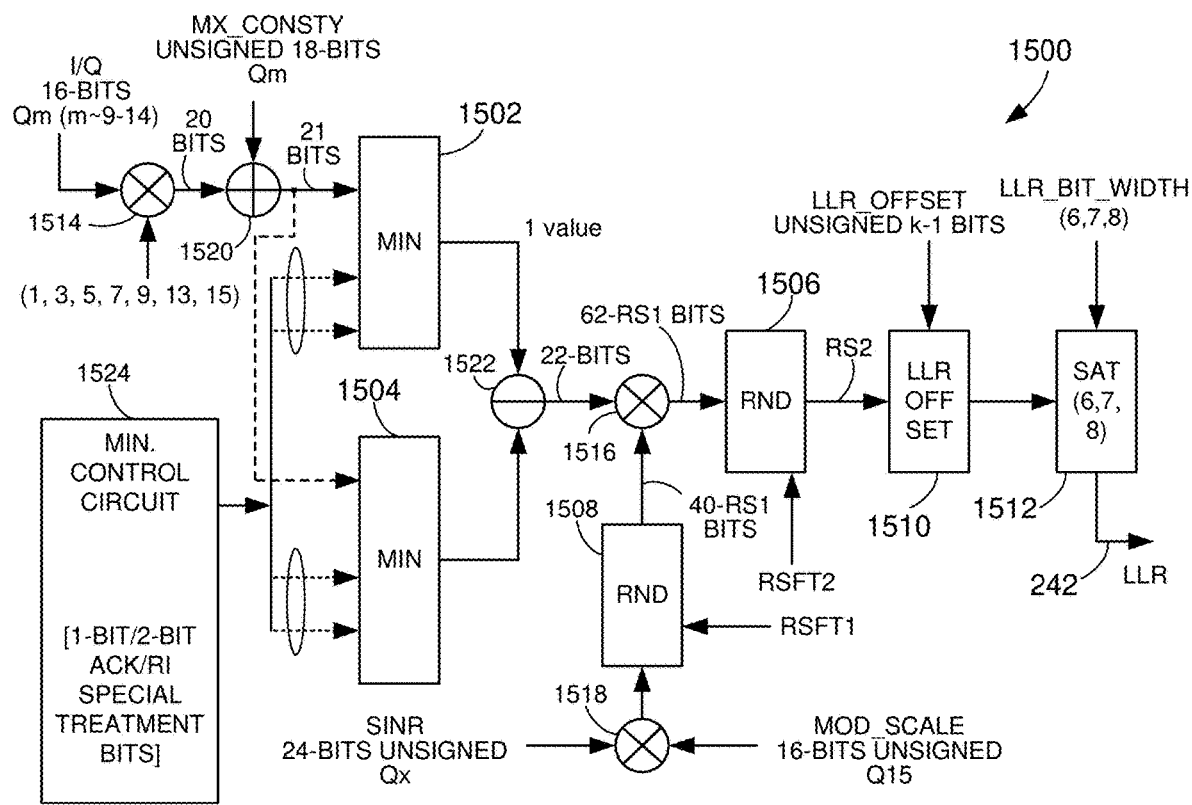
FIG. 14 shows an exemplary embodiment of the parameter table shown in FIG. 13
FIG. 15 shows an exemplary embodiment of a soft-demapper circuit for use in embodiments of the invention.

FIG. 14 shows an exemplary embodiment of the parameter table 1310 shown in FIG. 13. In an embodiment, the parameters table 1310 includes a column for decoder type 1402. Each decoder type 1402 includes parameters for a plurality of modulation coding scheme (MCS) values 1404. The parameters include a modulation (MOD) scale value 1406, first right shift (RSFT1) value 1408, a second right shift (RSFT2) value 1410, LLR offset value 1412, and a LLR bit-width value 1414. Based on the decoder type 1402 and MCS value 1404, the machine learning algorithm 1314 adjusts the soft-demapper parameters 256 to move a performance metric toward a target performance 1308. For example, the performance metric can be a minimal SINR needed to achieve a certain BLER, which can be defined by the user, such as a BLER of 10%. In an embodiment, the parameters of the parameter table 1310 can be initialized with any desired initial values.

FIG. 15 shows an exemplary embodiment of a soft-demapper circuit 1500 for use in embodiments of the invention. For example, the soft mapper circuit 1500 is suitable for use as at least a portion of the soft-demapper

216. In an embodiment, the soft-demapper circuit 1500 comprises minimization (MIN) detectors 1502 and 1504, rounding circuits 1506 and 1508, LLR offset circuit 1510, and saturation (SAT) circuit 1512. The circuit 1500 also comprises multipliers 1514, 1516, and 1518, adder 1520, and subtractor 1522.

During operation, received I/Q bits are input to the multiplier 1514. The multiplier 1514 also receives a selected constant (e.g., 1, 3, 5, 7, 9, 13, and 15) and the multiplied result is a 20-bit value that is input to the adder 1520. The adder 1520 also receives a constant (MX_CONSTY), which is an unsigned 18-bit value. The adder 1520 outputs the sum of its inputs as a 21-bit value that is input to both minimization circuits 1502 and 1504. Each minimization circuit outputs the minimum of its inputs. A minimization control circuit 1524 outputs control values to each minimization circuit 1502 and 1504. The control values control which value is output from each minimization circuit. For example, the minimum value is chosen for a particular modulation format. The outputs of the minimization circuits are input to the subtractor 1522 that subtracts the values and generates a 22-bit output that is input to the multiplier 1516. In an embodiment, the equation (EQ. 1) is implemented.

A second multiplier 1518 receives a SINR signal that is a 24-bit unsigned value and a modulation scale value that is a 16-bit unsigned value. The product of these signals is input to the rounding circuit 1508 which shifts and rounds its input value based on the first shift value (RSFT1). For example, the following operation is performed to generate an RS1 value.

[Input+(2^(RSFT1−1))]>>2^RSFT1=40-bit RS1 value; or

[Input+(2^(RSFT1−1))]/2^RSFT1=40-bit RS1 value

The RS1 value is input to the multiplier 1516 which multiplies its inputs to generate a 62-bit value that is input to the second rounding circuit 1506. The rounding circuit 1506 shifts and rounds its input value based on the second shift value (RSFT2). For example, the following operation is performed to generate an RS2 value.

[Input+(2^(RSFT2−1))]/2^RSFT2=40-bit RS2 value

The LLR offset circuit 1510 receives the RS2 value and an LLR offset value, which is an unsigned (k-1) bit value, and performs an offset operation. The output of the offset circuit 1510 is input to the saturation circuit 1512. The saturation circuit 1512 receives the LLR_bit_width value and scales its input to prevent saturation to determine the soft-demapped REs 242, which are processed into the raw LLR and combined data/UCI information 254 that is decoded by the decoder system 156.

Optimization of the LLR_Bit_Width

Decoders depending upon their internal implementation details can behave differently with different LLR bit widths. In a first operation, the optimal bit width at which the selected decoder achieves its hard decoding performance is determined. In an embodiment, the following operations are performed by processor 1302 to determine an optimal LLR bit width for use during the decoding process.

1. Maximize all multipliers and minimize all dividers forcing the LLRs into saturation. For example, the processor 1302 outputs the parameters to force the LLRs 242 into saturation.
2. Adjust the LLR_bit_width value 1414 for the particular decoder/MCS to achieve the best performance. For example, the processor 1302 adjusts the LLR_bit_width parameters to achieve the best LLR performance. The LLR_bit_width value is then saved in the parameters table 1310.

Optimization of Parameters Based on Machine Learning

Once the LLR_bit_width parameter is determined, the machine learning algorithm 1314 operates to adjust the remaining soft-demapping parameters to achieve target performance. In an embodiment, the following operations are performed by the machine learning circuit 250 to adjust the soft-demapping parameters.

1. A performance metric is determined by the performance metric circuit 1306.
2. The target performance 1308 is obtained from the memory 1304.
3. The machine learning algorithm 1314 utilizes the current performance metric and the target performance to adjust the MOD_SCALE 1406, RSF1 1408, RSFT2 1410 and LLR_OFFSET 1412 parameters for the particular decoder/MCS to move the performance metric toward the target performance. It should be noted that as a result of the above operations, each decoder will have its own unique set of configuration parameters to achieve an associated target performance. For example, the LLR bit-width parameter 1414 is determined for a particular decoder/MCS. The other parameters are set to initial conditions. The machine learning algorithm 1314 utilizes the current performance metric and the target performance to adjust the MOD_SCALE 1406, RSF1 1408, RSFT2 1410, and LLR_OFFSET 1412 parameters for the particular decoder/MCS to move the performance metric toward the target performance in an iterative process until the target performance is obtained. After each iteration, the updated parameters are saved in the parameters table 1310.

Figure 16:
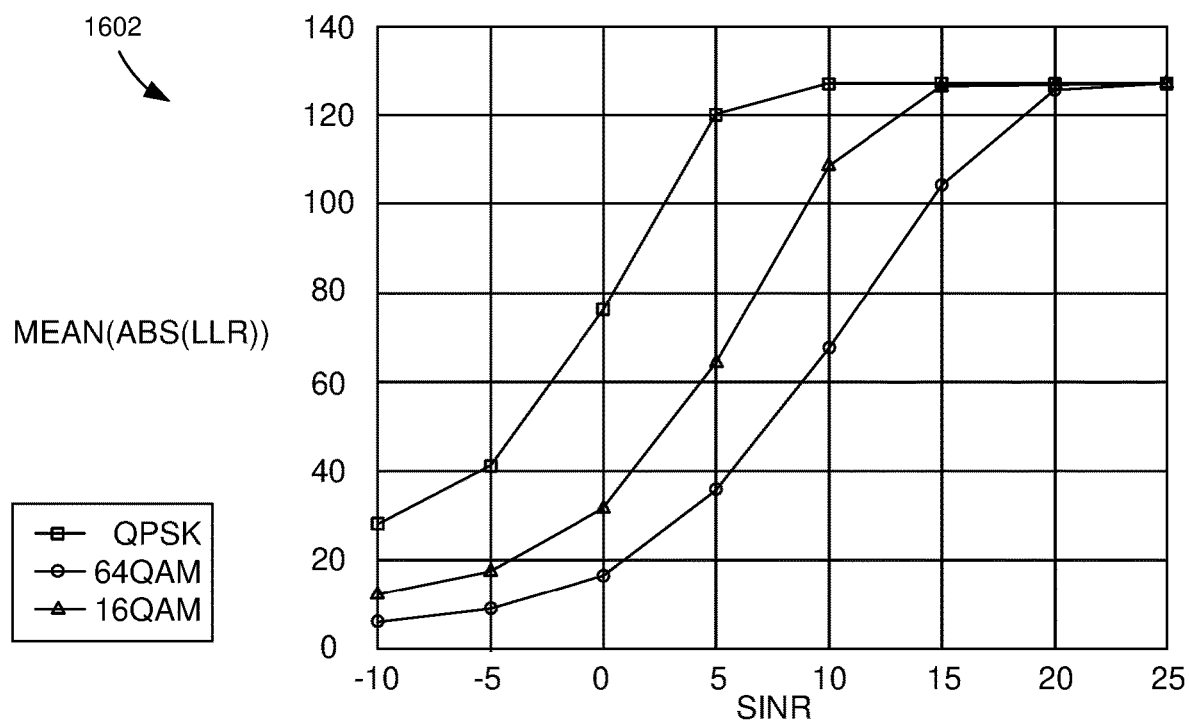
FIG. 16 shows exemplary graphs that illustrate the operation of the system.
Figure 16:
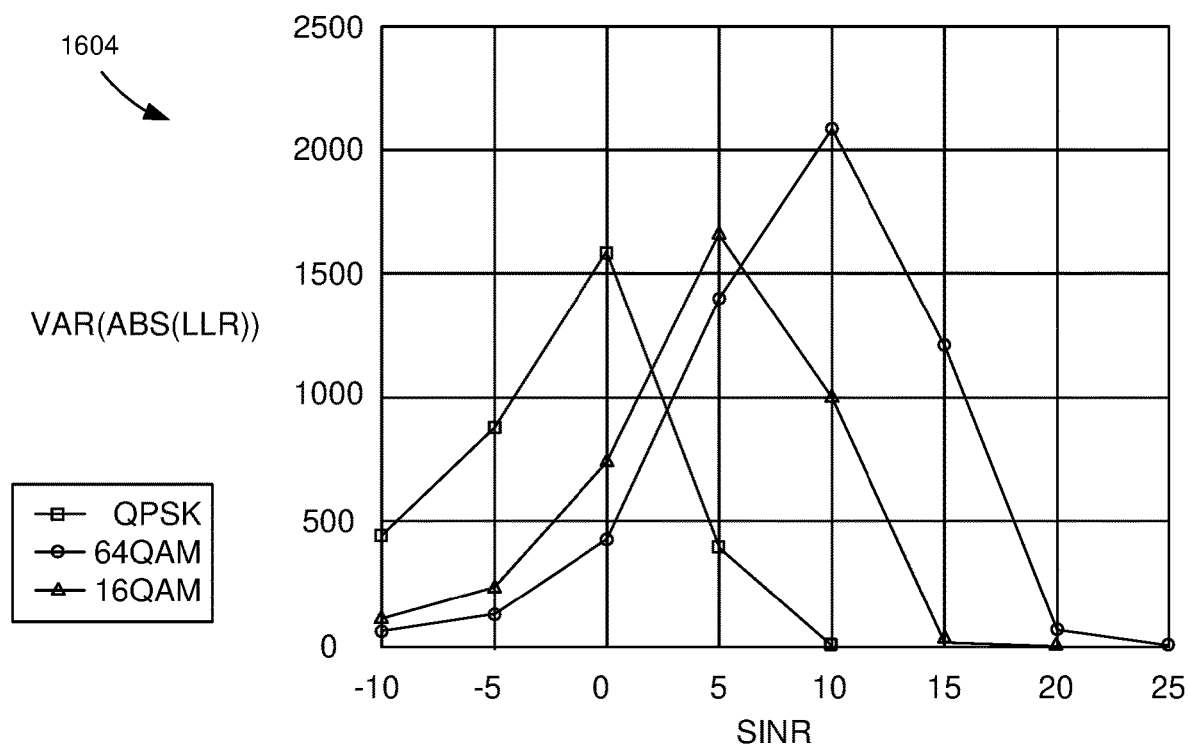

FIG. 16 shows exemplary graphs that illustrate the operation of the system to adjust LLR generation based on received SINR for difference modulation schemes. The graph 1602 shows a plot of the mean of the absolute value of the LLR values (e.g., mean (abs (LLR))) versus a signal to interference noise ratio (SINR). The graph 1604 shows a plot of the variance of the absolute value of the LLR values (e.g., var (abs (LLR))) versus the SINR. For example, the plots depict the LLR ranges generated by the LLR generator for a certain fixed configuration for different SINR values. In an embodiment, the LLR_bit_width parameter controls the upper and lower saturation limits of the LLRs, whereas the shift values RSFT1 and RSFT2 move the curves along the SINR axis determining where the saturation takes place. For each decoder type, these curves are carefully shaped for optimal performance. Having different internal implementation, each decoder that the LLR generator feeds requires a different set of soft-demapping configuration parameters. These optimal configuration parameters for each decoder will be generated by the machine learning algorithm 1314 with minimal or no external intervention. The machine learning algorithm 1314 receives feedback from the decoders in the form of performance metrics in order to drive the optimization process to achieve target performance.

Figure 17:
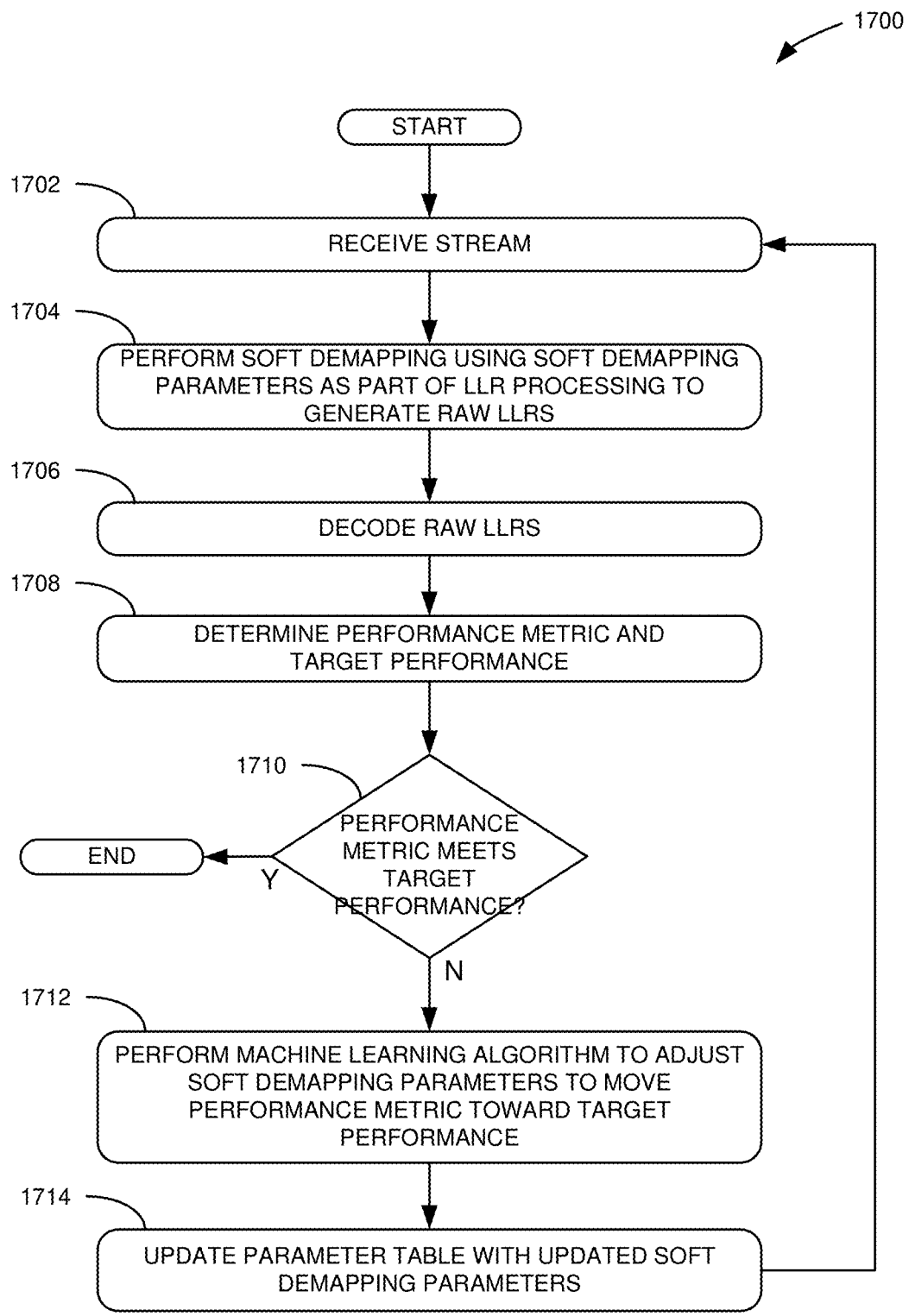
FIG. 17 shows an exemplary method for performing a machine learning algorithm to optimize performance in accordance with exemplary embodiments of a decoder system.

FIG. 17 shows an exemplary method 1700 for utilizing machine learning to optimize performance in accordance with exemplary embodiments of a decoder system. For example, the method 1700 is suitable for use with the portion of the descrambling and combining system shown in FIG. 12.

At block 1702, a stream of data, CSI2, and padding LLRs are received.

At block 1704, soft-demapping is performed using soft-demapping parameters as part of LLR processing to generate raw LLRs.

At block 1706, the raw LLRs are decoded by a selected decoder.

At block 1708, a performance metric and a target performance are determined. For example, the performance metric is determined by the performance metric circuit 1306 and the target performance 1308 is stored in the memory 1304.

At block 1710, a determination is made as to whether the performance metric meets the target performance. If the performance metric meets the performance target, the method ends. If the performance metric does not meet the performance target, the method proceeds to block 1712.

At block 1712, a machine learning algorithm is performed to adjust the soft-demapping parameters to move performance metric toward performance target. For example, the machine learning algorithm 1314 is performed.

At block 1714, the parameter table is updated with the updated soft-demapping parameters. For example, the parameters table 1310 is updated with the newly determined soft-demapper parameters. The method then proceeds to block 1702 to receive and process more of the received stream.

Thus, the method 1700 operates to utilize machine learning to optimize performance in accordance with exemplary embodiments of a decoder system. It should be noted that the operations of the method 1700 could be modified, added to, deleted, combined, rearranged, or otherwise changed within the scope of the embodiments.

Figure 18:
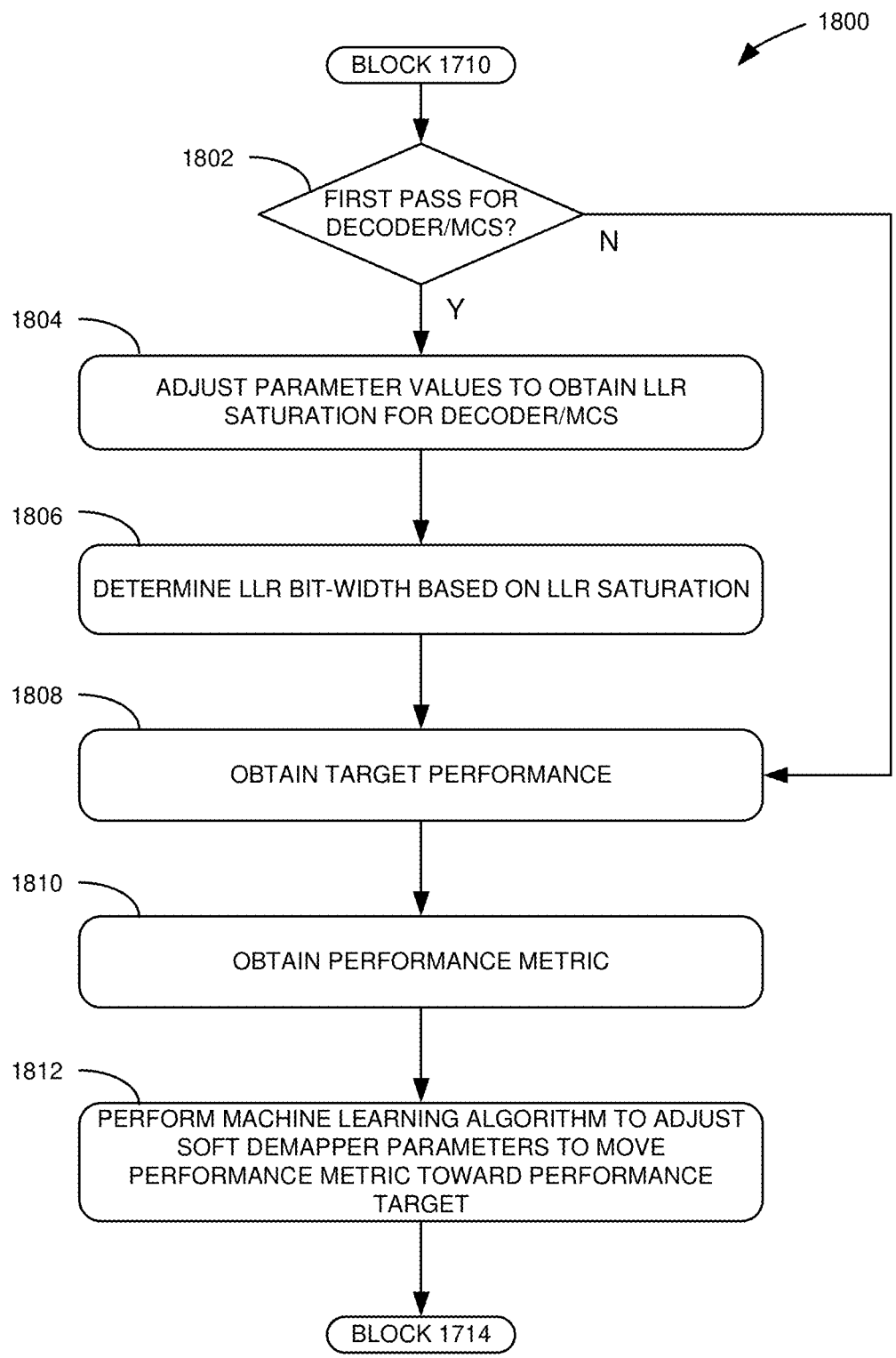
FIG. 18 shows an exemplary method for performing a machine learning algorithm in accordance with exemplary embodiments of a machine learning circuit.

FIG. 18 shows an exemplary method 1800 for performing a machine learning algorithm in accordance with exemplary embodiments of a machine learning circuit. For example, the method 1800 is suitable for use at block 1712 in FIG. 17. In an embodiment, the method 1800 is performed by the machine learning circuit 250 shown in FIG. 13.

At block 1802, a determination is made as to whether this is the first pass through the machining learning process for the selected decoder and MCS. If it is the first pass through, the method proceeds to block 1804. If it is not the first pass through, the method proceeds to block 1808.

At block 1804, the parameters values are adjusted to obtain LLR saturation for the selected decoder/MCS. For example, the parameters are set so that all multipliers are maximized and all dividers are minimized in the demapping circuit 1500 to force the LLRs into saturation for the selected decoder/MCS.

At block 1806, an LLR_bit_width value is determined for the selected decoder/MCS based on the LLR saturation level. The bit-width value is selected to avoid saturation.

At block 1808, a target performance for the selected decoder/MCS is obtained from the memory 1304. For example, the target performance 1308 is obtained from the memory 1304.

At block 1808, a performance metric for the selected decoder/MCS is obtained. For example, the performance metric circuit 1306 determines a performance metric for the selected decoder/MCS by analyzing decoded data 252. In an embodiment, the performance metric is a BLER value.

At block 1812, a machining learning algorithm is performed to adjust the soft-demapping parameters to move the performance metric toward target performance. In an embodiment, the MLC 250 performs the machine learning algorithm 1314 based on a reinforcement learning process to generate the updated parameters 256 to achieve the desired target performance. The determined soft-demapper parameters are pass to block 1714 where they are stored in the parameter table 1310.

Thus, the method 1800 operates to perform a machine learning algorithm to optimize performance in accordance with exemplary embodiments of a decoder system. It should be noted that the operations of the method 1800 could be modified, added to, deleted, combined, rearranged, or otherwise changed within the scope of the embodiments.

Figure 19:
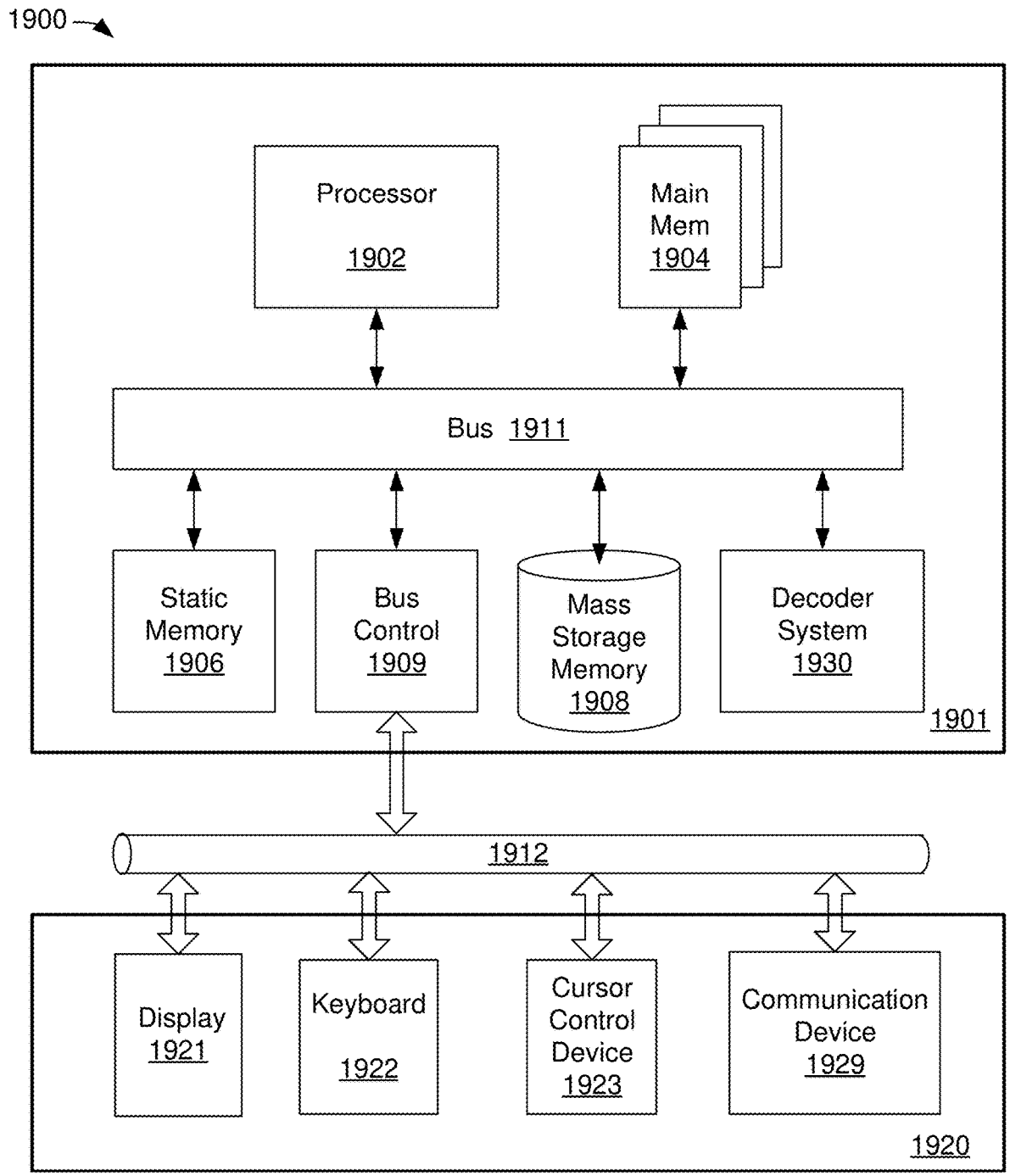
FIG. 19 shows a block diagram illustrating a processing system having an exemplary embodiment of a decoder system that includes a machine learning circuit.

FIG. 19 shows a block diagram illustrating a processing system 1900 having an exemplary embodiment of a decoder system 1930 that includes a machine learning circuit that adjust soft-demapping parameters to obtain a performance target for selected decoders. For example, in an embodiment, the decoder system 1930 includes the machine learning circuit 250 shown in FIG. 2. It will be apparent to those of ordinary skill in the art that other alternative computer system architectures may also be employed.

The system 1900 includes a processing unit 1901, an interface bus 1912, and an input/output ("IO") unit 1920. Processing unit 1901 includes a processor 1902, main memory 1904, system bus 1911, static memory device 1906, bus control unit 1909, mass storage memory 1908, and the decoder system 1930. Bus 1911 is used to transmit information between various components and processor 1902 for data processing. Processor 1902 may be any of a wide variety of general-purpose processors, embedded processors, or microprocessors such as ARM® embedded processors, Intel® Core™2 Duo, Core™2 Quad, Xeon®, Pentium™ microprocessor, AMD® family processors, MIPS® embedded processors, or Power PC™ microprocessor.

Main memory 1904, which may include multiple levels of cache memories, stores frequently used data and instructions. Main memory 1904 may be RAM (random access memory), MRAM (magnetic RAM), or flash memory. Static memory 1906 may be a ROM (read-only memory), which is coupled to bus 1911, for storing static information and/or instructions. Bus control unit 1909 is coupled to buses 1911-1912 and controls which component, such as main memory 1904 or processor 1902, can use the bus. Mass storage memory 1908 may be a magnetic disk, solid-state drive ("SSD"), optical disk, hard disk drive, floppy disk, CD-ROM, and/or flash memories for storing large amounts of data.

I/O unit 1920, in one example, includes a display 1921, keyboard 1922, cursor control device 1923, and communication device 1929. Display device 1921 may be a liquid crystal device, flat panel monitor, cathode ray tube ("CRT"), touch-screen display, or other suitable display device. Display 1921 projects or displays graphical images or windows. Keyboard 1922 can be a conventional alphanumeric input device for communicating information between computer system 1900 and computer operators. Another type of user input device is cursor control device 1923, such as a mouse, touch mouse, trackball, or other type of cursor for communicating information between system 1900 and users.

Communication device 1929 is coupled to bus 1912 for accessing information from remote computers or servers through wide-area network. Communication device 1929 may include a modem, a router, or a network interface device, or other similar devices that facilitate communication between computer 1900 and the network. In one aspect, communication device 1929 is configured to perform wireless functions. Alternatively, decoder system 1930 and communication device 1929 perform resource element categorization, descrambling and combining, decoding, and machine learning optimization functions in accordance with embodiments of the present invention.

The decoder system 1930, in one aspect, is coupled to bus 1911 and is configured to perform decoding and machine learning and optimization functions on received uplink communications as described above to improve overall receiver performance. In an embodiment, the decoder system 1930 comprises hardware, firmware, or a combination of hardware and firmware.

In an embodiment, an apparatus is provided that includes means for soft-demapping resource elements based on soft-demapping parameters as part of a process to generate log-likelihood ratios (LLR) values, which in an embodiment comprises the soft-demapper 216. The apparatus also includes means for decoding the LLRs to generate decoded data, which in an embodiment comprises the decoder system 156. The apparatus also includes means for identifying a target performance value, means for determining a performance metric from the decoded data, and means for performing a machine learning algorithm that dynamically adjusts the soft-demapping parameters to move the performance metric toward the target performance value, which in an embodiment comprises the machine learning circuit 250.

While particular embodiments of the present invention have been shown and described, it will be obvious to those skilled in the art that, based upon the teachings herein, changes and modifications may be made without departing from the exemplary embodiments of the present invention and its broader aspects. Therefore, the appended claims are intended to encompass within their scope all such changes and modifications as are within the true spirit and scope of this exemplary embodiments of the present invention.

What is claimed is:

1. An apparatus for processing data transmitted via a communication network, comprising:
    a soft-demapper configured to generate log-likelihood ratios (LLR) values via soft-demapping resource elements in accordance with soft-demapping parameters;
    a decoder coupled to the soft-demapper and configured to generate decoded data based on the LLR values;
    a performance metric circuit coupled to the decoder and identifying a performance metric from the decoded data; and
    a processor coupled to the performance metric circuit and configured to adjust one or more soft-demapping parameters in response to the performance metric and a target performance in accordance with an operation of a machine learning algorithm, wherein the processor is able to update the soft-demapping parameters based on a selected LLR bit-width value via performance of the machine learning algorithm.

2. The apparatus of claim 1, further comprising a base station front end coupled to the soft-demapper and configured to obtain the resource elements derived from symbols received in a new radio (NR) uplink transmission.

3. The apparatus of claim 1, wherein the soft-demapping parameters include a modulation scale (MOD_SCALE) value.

4. The apparatus of claim 1, wherein the soft-demapping parameters include a first shift (RSFT1) value.

5. The apparatus of claim 1, wherein the soft-demapping parameters include a second shift (RSFT2) value.

6. The apparatus of claim 1, wherein the soft-demapping parameters include an LLR offset value.

7. The apparatus of claim 1, wherein the soft-demapping parameters include an LLR bit-width value.

8. The apparatus of claim 1, wherein the processor is able to adjust the soft-demapping parameters to determine an LLR saturation level via execution of the machine learning algorithm.

9. The apparatus of claim 1, wherein the processor is capable of performing an iterative process of machine learning algorithm to update the soft-demapping parameters in accordance with the target performance.

10. A method for processing data transmitted via a communication network, comprising:
    generating log-likelihood ratios (LLR) values via soft-demapping resource elements in accordance with soft-demapping parameters;
    activating a decoder to generate decoded data based on the LLR values;
    identifying a performance metric in response to the decoded data;
    adjusting one or more soft-demapping parameters in response to the performance metric and a target performance in accordance with an operation of a machine learning algorithm; and
    updating the soft-demapping parameters based on a selected LLR bit-width value via performance of the machine learning algorithm.

11. The method of claim 10, further comprising obtaining resource elements derived from symbols received in a new radio (NR) uplink transmission.

12. The method of claim 10, further comprising identifying a modulation scale (MOD_SCALE) value in accordance with the soft-demapping parameters.

13. The method of claim 10, further comprising identifying a first shift (RSFT1) value in accordance with the soft-demapping parameters.

14. The method of claim 10, further comprising identifying a second shift (RSFT2) value in accordance with the soft-demapping parameters.

15. The method of claim 10, further comprising identifying an LLR offset value in response to the soft-demapping parameters.

16. The method of claim 10, further comprising identifying an LLR bit-width value in response to the soft-demapping parameters.

17. The method of claim 10, further comprising adjusting the soft-demapping parameters to determine an LLR saturation level via execution of the machine learning algorithm.

18. The method of claim 10, further comprising performing an iterative process of machine learning algorithm to update the soft-demapping parameters in accordance with the target performance.

19. An apparatus for processing data transmitted via a communication network, comprising:
    means for generating log-likelihood ratios (LLR) values via soft-demapping resource elements in accordance with soft-demapping parameters;
    means for activating a decoder to generate decoded data based on the LLR values;
    means for identifying a performance metric in response to the decoded data;
    means for adjusting one or more soft-demapping parameters in response to the performance metric and a target performance in accordance with an operation of a machine learning algorithm; and
    means for adjusting the soft-demapping parameters based on a selected LLR bit-width value via performance of a machine learning circuit for identifying a performance value.

20. The apparatus of claim 19, further comprising means for obtaining resource elements derived from symbols received in a new radio (NR) uplink transmission.

21. The apparatus of claim 19, further comprising means for identifying a modulation scale (MOD_SCALE) value in accordance with the soft-demapping parameters.

22. The apparatus of claim 19, further comprising means for identifying a first shift (RSFT1) value in accordance with the soft-demapping parameters.

23. The apparatus of claim 19, further comprising means for identifying a second shift (RSFT2) value in accordance with the soft-demapping parameters.

24. The apparatus of claim 19, further comprising means for identifying an LLR offset value in response to the soft-demapping parameters.

25. The apparatus of claim 19, further comprising means for identifying an LLR bit-width value in response to the soft-demapping parameters.

* * * * *